US010806043B2

(12) United States Patent
Lee

(10) Patent No.: US 10,806,043 B2
(45) Date of Patent: Oct. 13, 2020

(54) HOLDER COMBINED WITH CRADLE FOR PORTABLE TERMINAL

(71) Applicant: Ki Beom Lee, Incheon (KR)

(72) Inventor: Ki Beom Lee, Incheon (KR)

( * ) Notice: Subject to any disclaimer, the term of this patent is extended or adjusted under 35 U.S.C. 154(b) by 0 days.

(21) Appl. No.: 16/593,167

(22) Filed: Oct. 4, 2019

(65) Prior Publication Data

US 2020/0163240 A1 May 21, 2020

Related U.S. Application Data

(63) Continuation-in-part of application No. PCT/KR2018/009433, filed on Aug. 17, 2018.

(30) Foreign Application Priority Data

Aug. 18, 2017 (KR) .......................... 10-2017-0105078
Mar. 7, 2018 (KR) .......................... 10-2018-0027128

(51) Int. Cl.
*H05K 5/02* (2006.01)

(52) U.S. Cl.
CPC ......... *H05K 5/0234* (2013.01); *H05K 5/0204* (2013.01); *H05K 5/0221* (2013.01); *H05K 5/0226* (2013.01)

(58) Field of Classification Search
CPC .. H05K 5/0234; H05K 5/0204; H05K 5/0221; H05K 5/0226; H04B 1/3877; H04B 1/3888; F16M 11/04; A45F 2200/0516; A45C 2200/15; H04M 1/04
See application file for complete search history.

(56) References Cited

U.S. PATENT DOCUMENTS

| 9,421,920 B2 | 8/2016 | Jang |
| 10,060,574 B2 * | 8/2018 | Zhang ..................... G06F 1/166 |
| D862,453 S * | 10/2019 | Liang .......................... D14/253 |
| 10,638,627 B1 * | 4/2020 | Stime .................... G06F 1/1628 |
| 2006/0231695 A1 | 10/2006 | Lim et al. |
| 2008/0099638 A1 | 5/2008 | Diener et al. |

(Continued)

FOREIGN PATENT DOCUMENTS

| CN | 106716977 A | 5/2017 |
| JP | 3181524 U | 2/2013 |

(Continued)

OTHER PUBLICATIONS

Japanese Office Action for corresponding JP Patent Application No. 2018-550768 dated Nov. 5, 2019.
U.S. Office Action for U.S. Appl. No. 16/135,440 dated Feb. 25, 2019.
International Search Report dated Nov. 30, 2018 for PCT/KR2018/009433.

(Continued)

*Primary Examiner* — Abhishek M Rathod
(74) *Attorney, Agent, or Firm* — Cantor Colburn LLP

(57) ABSTRACT

According to an embodiment of the present disclosure, there is provided a stand-holder for a portable terminal, the stand-holder comprising: a support portion fixed to a rear surface of the portable terminal; a holding portion; and a coupling portion operatively coupled to each of the support portion and the holding portion. The coupling portion and the support portion are operatively coupled to each other, such that the coupling portion is rotated relative to the support portion. The coupling portion and the holding portion are operatively coupled to each other, such that the holding portion is rotated relative to the coupling portion.

10 Claims, 40 Drawing Sheets

(56) References Cited

U.S. PATENT DOCUMENTS

| | | |
|---|---|---|
| 2010/0084522 A1 | 4/2010 | Zhou et al. |
| 2011/0031287 A1 | 2/2011 | Le Gette et al. |
| 2011/0127392 A1* | 6/2011 | Carter .................... F16M 11/38 248/121 |
| 2011/0253850 A1 | 10/2011 | Bau |
| 2012/0042476 A1 | 2/2012 | Karmatz |
| 2012/0043452 A1* | 2/2012 | Karmatz .................. B25G 1/04 248/558 |
| 2014/0191095 A1 | 7/2014 | Le Gette et al. |
| 2014/0353453 A1* | 12/2014 | Quijano ............. F16M 11/2021 248/419 |
| 2015/0250357 A1* | 9/2015 | Zhitnitsky ............... A47J 36/34 248/423 |
| 2015/0318885 A1 | 11/2015 | Earle |
| 2016/0036480 A1 | 2/2016 | Hirsch |
| 2019/0178438 A1* | 6/2019 | Liang .................... F16M 13/04 |

FOREIGN PATENT DOCUMENTS

| | | |
|---|---|---|
| KR | 1020140007050 A | 1/2014 |
| KR | 2020140003203 U | 5/2014 |
| KR | 1020140123649 A | 10/2014 |
| WO | 2013050065 A1 | 4/2013 |

OTHER PUBLICATIONS

English Translation of Office Action dated May 7, 2020, issued in Corresponding Chinese Patent Application No. 201880001481.4, 9 pages.

Extended Search Report dated Jun. 19, 2020 issued in EP18768748. 8, 8 pp.

Office Action dated May 7, 2020, issued in Corresponding Chinese Patent Application No. 201880001481.4, 9 pages.

* cited by examiner

HOLDER COMBINED WITH CRADLE FOR PORTABLE TERMINAL

TECHNICAL FIELD

The present disclosure relates to a stand-holder for a portable terminal, and more particularly, to a stand-holder for a portable terminal, which has a foldable structure in the form of "⊤" and thus can have its size adjusted to an optimal size according to a size of a user's finger, which is in contact with both an upper portion and a lower portion of the user's finger, thereby providing a more comfortable and stable grip, and which has its shape transformed to the shape of "A" with respect to a portable terminal by an one-touch operation, and brings a front end of a holding portion into contact with a rear surface of the terminal for use, and also, stands the terminal on a floor surface at a predetermined angle in the landscape or portrait orientations, such that a user can view a video or surf the web more comfortably.

BACKGROUND ART

Recently, portable terminals such as smartphones or tablet PCs are widely used, and are essential portables to people of all ages and both sexes.

As displays of portable terminals become larger, total sizes of portable terminals increase and thickness becomes thinner, and the portable terminals provide various functions such as enjoying videos or music, taking pictures, searching the Internet, and scheduling, in addition to a normal telephony function, and are increasingly utilized through various applications. Therefore, people tend to use portable terminals while using public transportation or walking regardless of time and place.

However, in the case of a large and thin portable terminal, it may be difficult to operate it with one hand, and also, the terminal is easy to slip from user's hand. Therefore, users often drop portable terminals.

To solve these problems, holder devices formed in various shapes such as a ring or a hook are attached to portable terminals or rear surfaces of cases thereof, and are used. However, it is impossible to adjust the holder devices according to sizes of users' fingers or hands, and also, users may not have a good grip when holding the holder devices. Therefore, there are problems that it is not easy to input texts or take pictures, and there is a limit to changing directions, and thus portability and maneuverability deteriorate.

As a solution to the above-described problems, Korean Patent Laid-Open Publication No. 10-2014-0007050 discloses a case for a portable device, and the main technical feature thereof is that the case includes a support plate having a coupling recess formed on a front surface thereof to allow a portable device to be attachably and detachably coupled thereto, a rod coupled to a rear surface of the support plate, and a holding plate coupled to the other end of the rod and spaced apart from the support plate.

That is, the related-art technology described above is characterized in that the support plate is in contact with user's palm and the holding plate is in contact with the back of user's hand with the rod being inserted between user's two fingers, such that a holding operation is simple and the user can stably hold the portable device. However, the rod should be inserted into a deep position between fingers in order for the user to stably hold the portable device, and it is not easy to operate the portable device with one hand while holding it since the support plate is in contact with user's palm.

More specifically, the user may operate the portable device only by using user's thumb while holding the portable device, and to operate the portable device with user's thumb, the user should place the rod on the outside between index and middle fingers or between middle and ring fingers. However, the related-art technology enables the user to stably hold the portable device only when the support plate is in contact with user's palm and the holding plate is in contact with the back of user's hand. Therefore, when the user operates the portable device with user's thumb, holding is unstable, and it is not easy to operate the portable device with user's thumb when the portable device is stably held.

In addition, since the related-art technology requires a separate stand to stand the portable device on a floor surface at a predetermined angle, there is inconvenience in using.

PRIOR ART DOCUMENTS

Patent Documents

1. Korean Patent Laid-Open Publication No. 10-2014-0007050 (published on Jan. 16, 2014)

DETAILED DESCRIPTION OF THE PRESENT DISCLOSURE

Technical Objects

One or more embodiments of the present disclosure provide a stand-holder for a portable terminal, the stand-holder comprising: a support portion fixed to a rear surface of the portable terminal; a holding portion; and a coupling portion operatively coupled to the support portion and the holding portion, the coupling portion being formed in a bar-like shape comprising a first end and a second end.

The first end of the coupling portion and the support portion are operatively coupled to each other, such that the coupling portion is rotated relative to the support portion, and the second end of the coupling portion and the holding portion are operatively coupled to each other, such that the holding is rotated relative to the coupling portion, The stand-holder for the portable terminal has an unfolded state and a folded state, and exists in any one state of the unfolded state and the folded state according to a user's selection.

The unfolded state is a state in which the support portion and the coupling portion are spaced apart from each other, and the folded state is a state in which the coupling portion is received in the holding portion and the support portion and the coupling portion are detachably coupled to each other in contact with each other, The first end of the coupling portion and the support portion are operatively coupled to each other, such that the coupling portion receives torque in a first direction, and the second end of the coupling portion and the holding portion are operatively coupled to each other, such that the holding portion receives torque in a second direction, and the first direction is a direction in which the coupling portion is erected, and the second direction is a direction in which erection of the coupling portion in the first direction is interfered with.

Advantageous Effects

According to the present disclosure, the size of the stand-holder is adjusted to an optimal size according to a size of a user's finger, and the back of user's hand is pressed by using the seesaw structure. Therefore, a user can operate the portable terminal while stably griping the portable terminal only with one hand regardless of the size of the portable terminal size.

In addition, according to the present disclosure, the support portion attached to the portable terminal is formed to have a predetermined thickness, and to support a tip of a finger. Therefore, a more comfortable and stable grip can be provided, and also, maneuverability can be enhanced when the user grips the portable terminal. In addition, there is an additional effect of enlarging an operable range.

In addition, according to the present disclosure, the folded state of the coupling member is automatically released by a one-touch operation, such that the user can easily wear. The front end of the holding portion is automatically supported on the rear surface of the portable terminal, such that a switchover between the function as a holder and the function as a stand can be rapidly performed without an additional operation.

In addition, according to the present disclosure, the size of the holding portion is enlarged, and stability can be enhanced when the stand-holder is used as a holder or stand.

BRIEF DESCRIPTION OF THE DRAWINGS

FIG. 2 is an exploded perspective view of the stand-holder illustrated in

FIG. 1;

Figure 1:
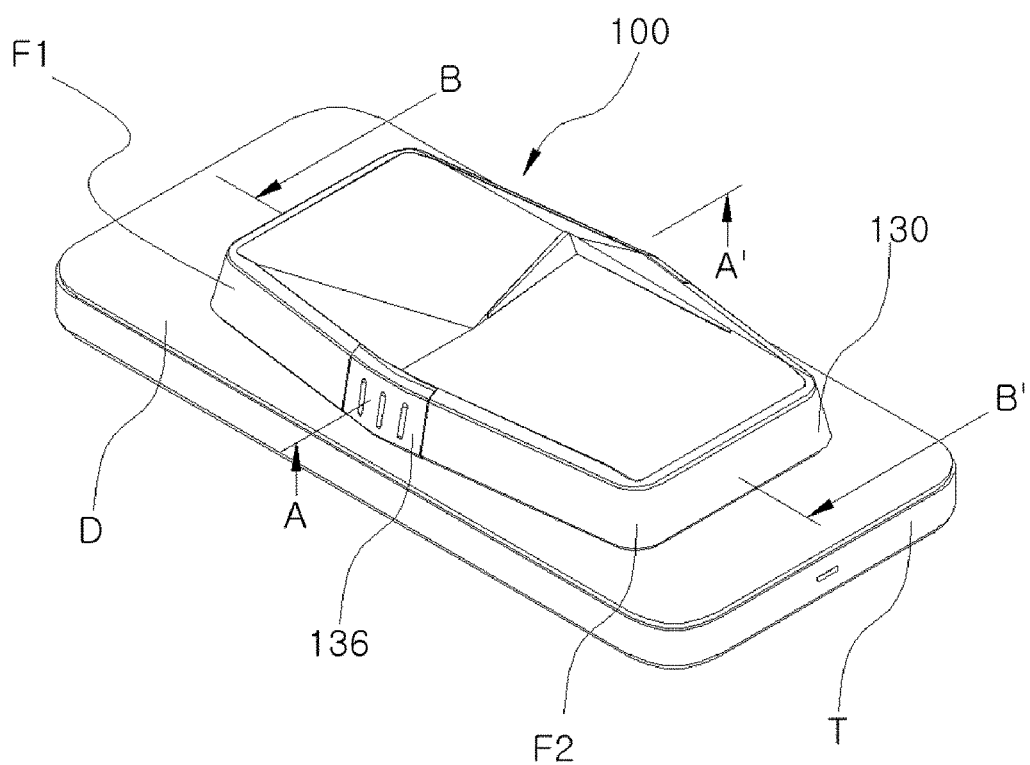
FIG. 1 is a perspective view illustrating a stand-holder for a portable terminal according to the present disclosure.

EXPLANATION OF SIGNS 100, 200: stand-holder 110, 210: support portion
112, 212: support member 112a, 212a: receiving recess
112b, 212b: seating recess 114, 214: housing
116: attaching means 120, 220: coupling portion
122, 222: coupling member 122a: first coupling member
122b: second coupling member 124, 224: first pivoting member
126, 226: second pivoting member 126a, 226a: second torsion spring
130, 230: holding portion 132, 232: holding member
133, 233: support portion receiving recess 134, 234: case
136: button 138: locking protrusion
138a: first locking projection 139: third torsion spring
140, 240: first torsion spring

BEST MODE FOR EMBODYING THE INVENTION

Exemplary embodiments will now be described more fully with reference to the accompanying drawings to clarify aspects, features and advantages of the inventive concept. The exemplary embodiments may, however, be embodied in many different forms and should not be construed as limited to the exemplary embodiments set forth herein. Rather, the exemplary embodiments are provided so that this disclosure will be thorough and complete, and will fully convey the scope of the application to those of ordinary skill in the art.

If the terms such as 'first' and 'second' are used to describe elements, these elements should not be limited by such terms. These terms are used for the purpose of distinguishing one element from another element only. The exemplary embodiments include their complementary embodiments.

As used herein, the phrase "A element and/or B element" is used to mean "at least one of the A element and the B element."

When the "A element" and the "B element" are referred to as being coupled to each other, the A element and the B element may be coupled to each other directly or indirectly. Herein, indirectly coupling means that there is one or more third elements between the A element and the B element.

It is to be understood that if an element (e.g., a first element) is referred to, with or without the term "operatively" or "communicatively", as "coupled with/to" or "connected to" another element (e.g., a second element), it means that the first element is directly coupled to the second element mechanically or electrically and/or electronically, or the first element is coupled to the second element via another element (e.g., a third element).

The terms such as "front," "back," "up," "down," "top," "bottom," "left," "right," "lateral," "horizontal," or "vertical" may be used in the present specification, and these terms are used for convenience of explanation of the present disclosure.

Hereinafter, preferred embodiments of a stand-holder for a portable terminal according to the present disclosure will be described in detail with reference to the accompanying drawings.

Definition of Terms

Figure 10:
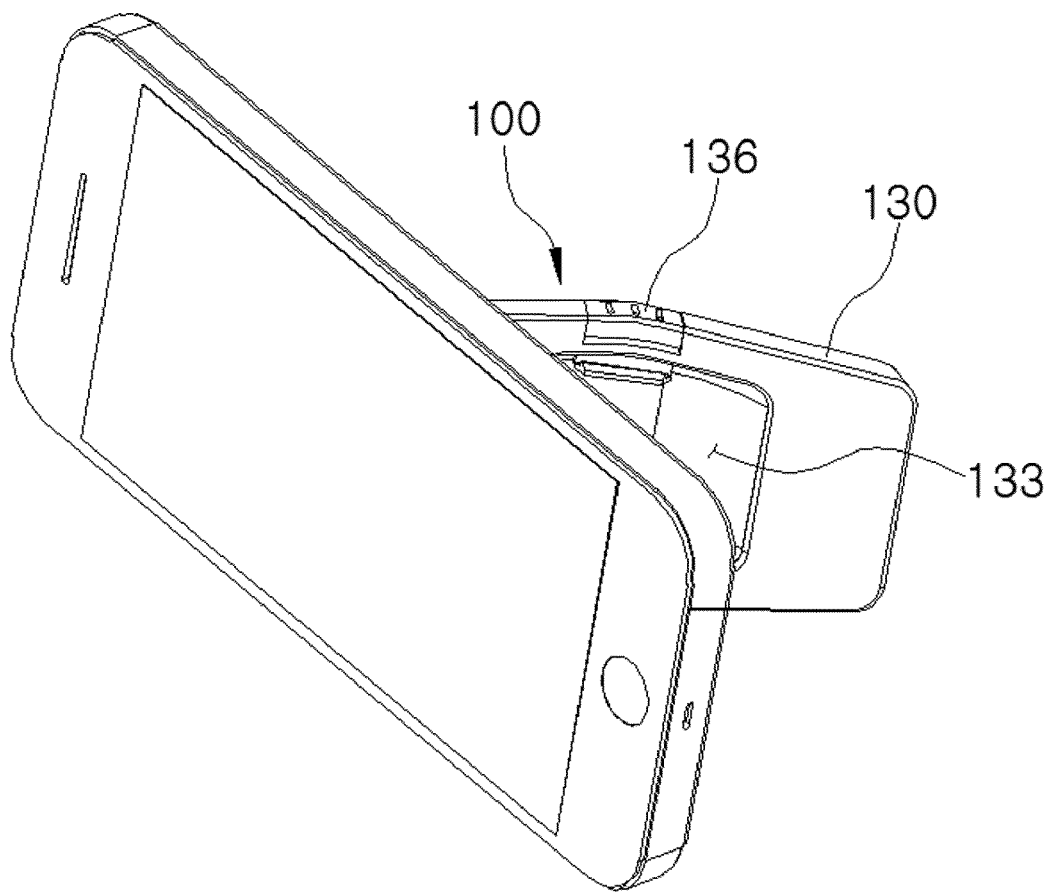
Figure 11:
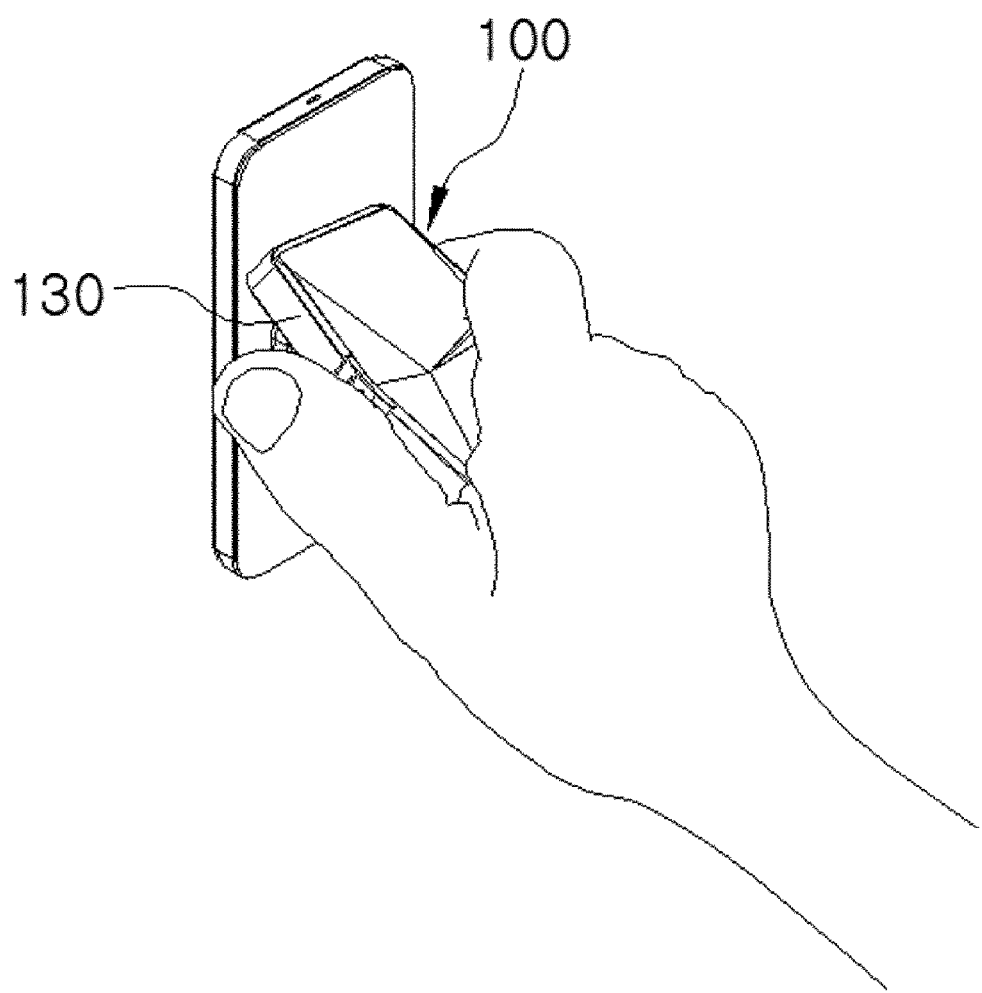
Figure 17:
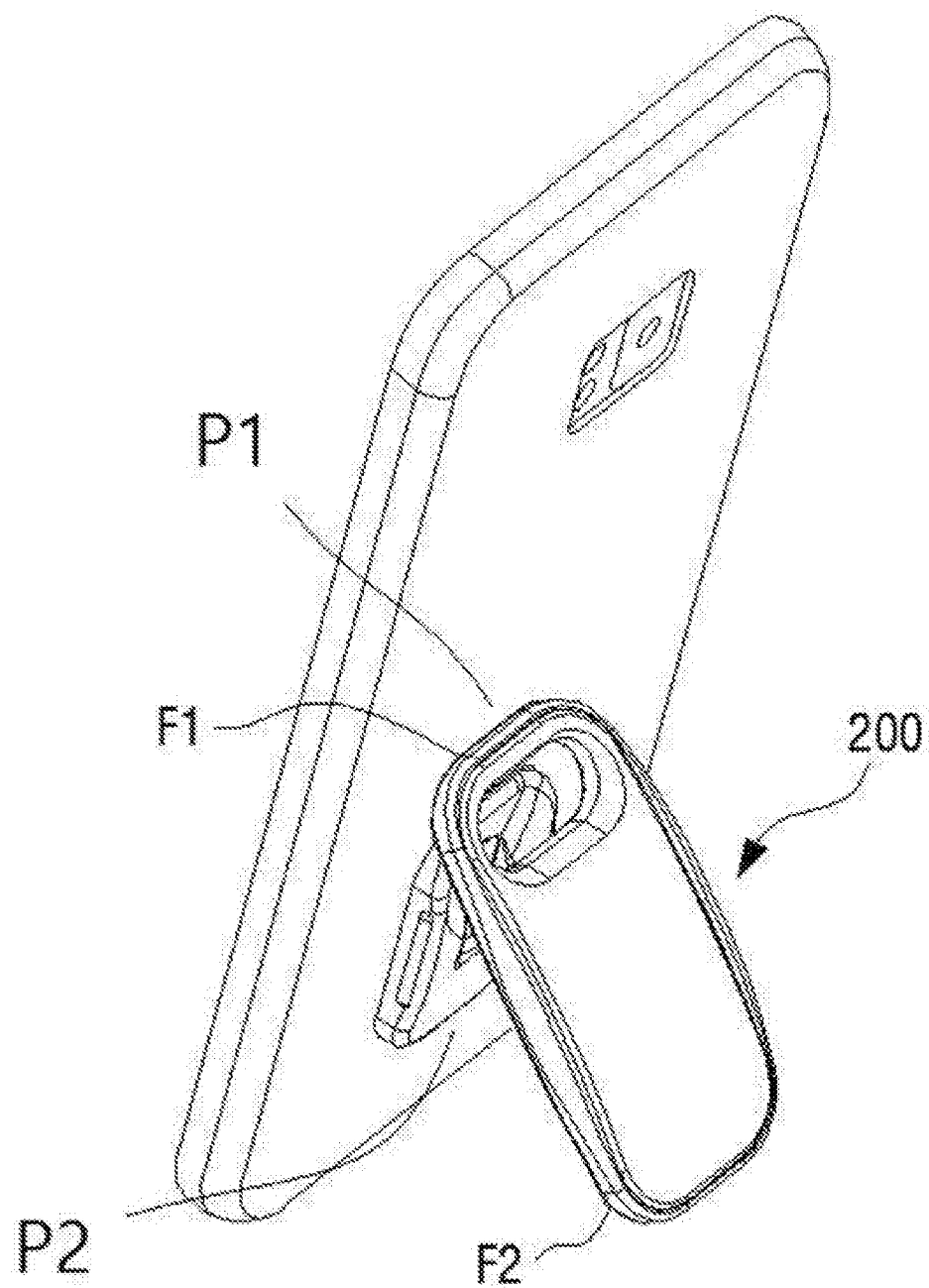
FIG. 17 is a view illustrating the stand-holder of the second embodiment when the stand-holder is used as a stand.

In the present specification, a "seesaw" structure or "A"-shaped structure refers to a structure illustrated in FIG. 10 or 17. The "seesaw" structure or the "A"-shaped structure enables the stand-holder to function as a stand and to function as a holder.

In the present specification, a "longitudinal direction" of a structure of a rectangular shape, a cylindrical shape, or a certain shape is defined as a direction of the longest distance from an inner center of the structure to the outside. For example, a longitudinal direction of a cylindrical structure refers to a direction of a line extending to the outside through an inner center of the cylinder along a column.

The inner center of the rectangular shape, the cylindrical shape, or the certain shape refers to a substantially center point of an inside of the shape. In the present specification, an "unfolded state" refers a state in which the stand-holder is used as a stand or a holder as shown in FIG. 8, 9, 10, 11, 12, 15, or 17, and a "folded state" refers to a state as shown in FIG. 1, 3, or 13.

According to embodiments (including a first embodiment and a second embodiment) of the present disclosure, the following exemplary features are provided.

The first feature is that the stand-holder for the portable terminal according to an embodiment of the present disclosure provides both a function as a stand and a function as a holder.

The second feature is that, when the stand-holder for the portable terminal according to an embodiment is in the unfolded state, the stand-holder naturally has the "A"-shaped structure or the "seesaw" structure, such that the portable terminal can be easily laid in the landscape or portrait orientation.

The third feature is that, when the stand-holder for the portable terminal according to an embodiment is folded, the stand-holder can be as slim as possible.

The fourth feature is that the stand-holder for the portable terminal according to an embodiment has a structure easy to place user's finger thereon, such that stability and convenience can be provided when the portable terminal is operated.

First Embodiment

Figure 2:
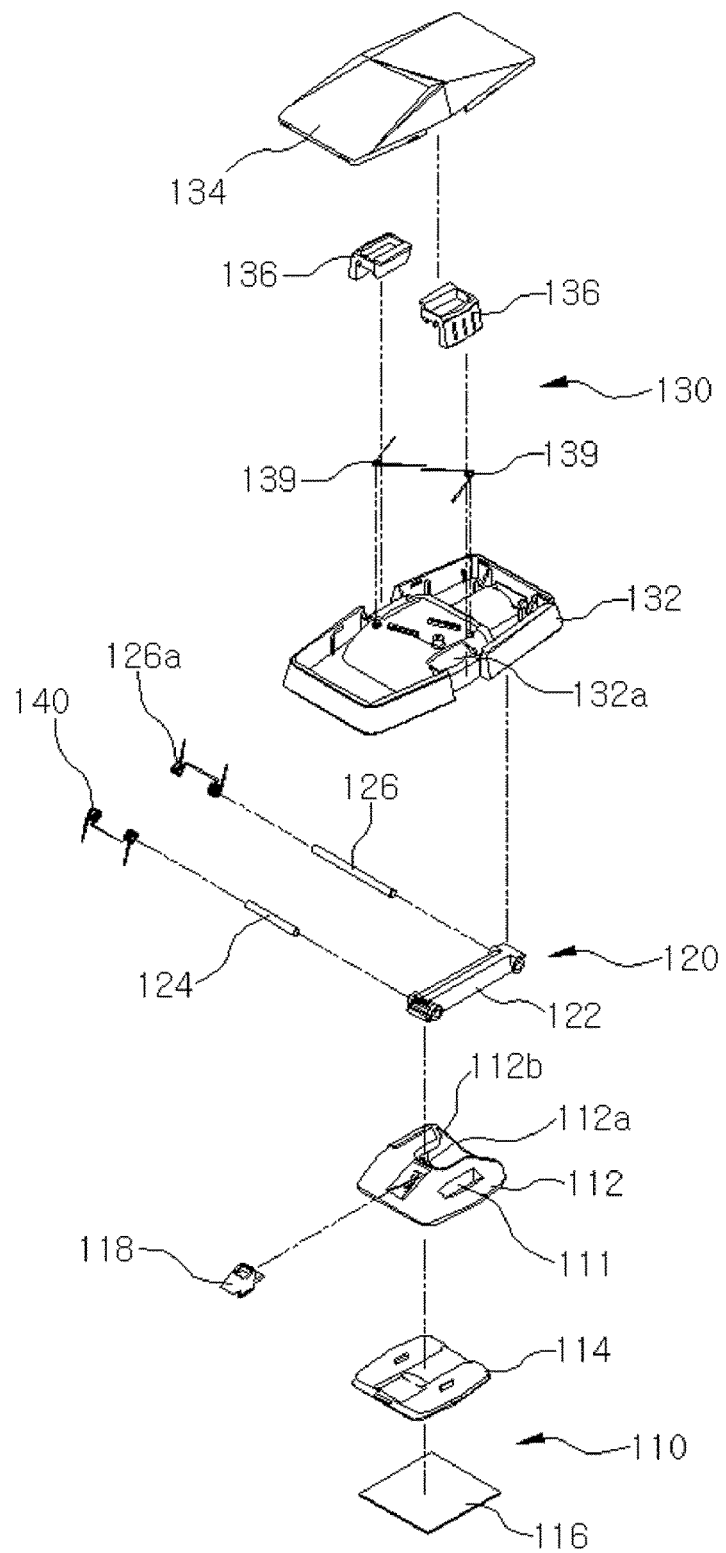
Figure 3A:
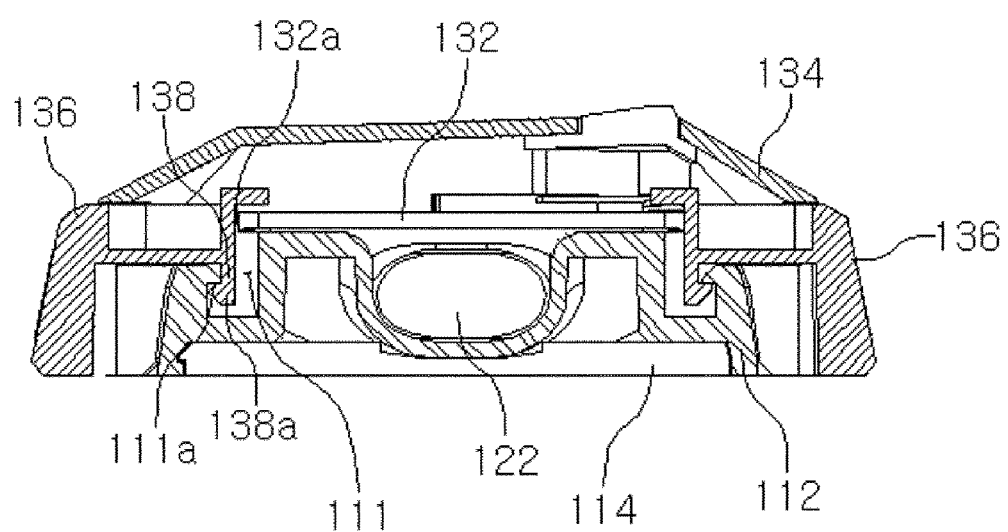
FIGS. 3A and 3B are cross-sectional views taken on line A-A' of FIG. 1.
Figure 3B:
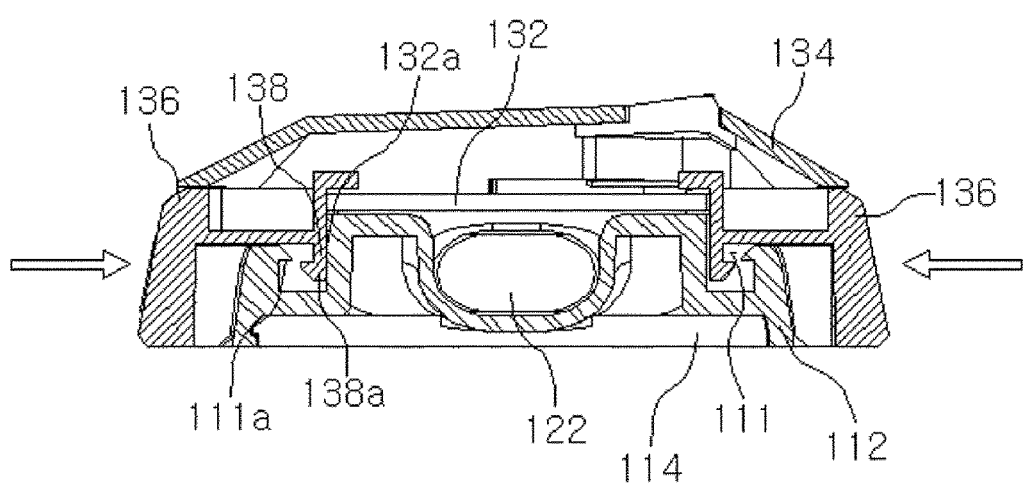
Figure 4A:
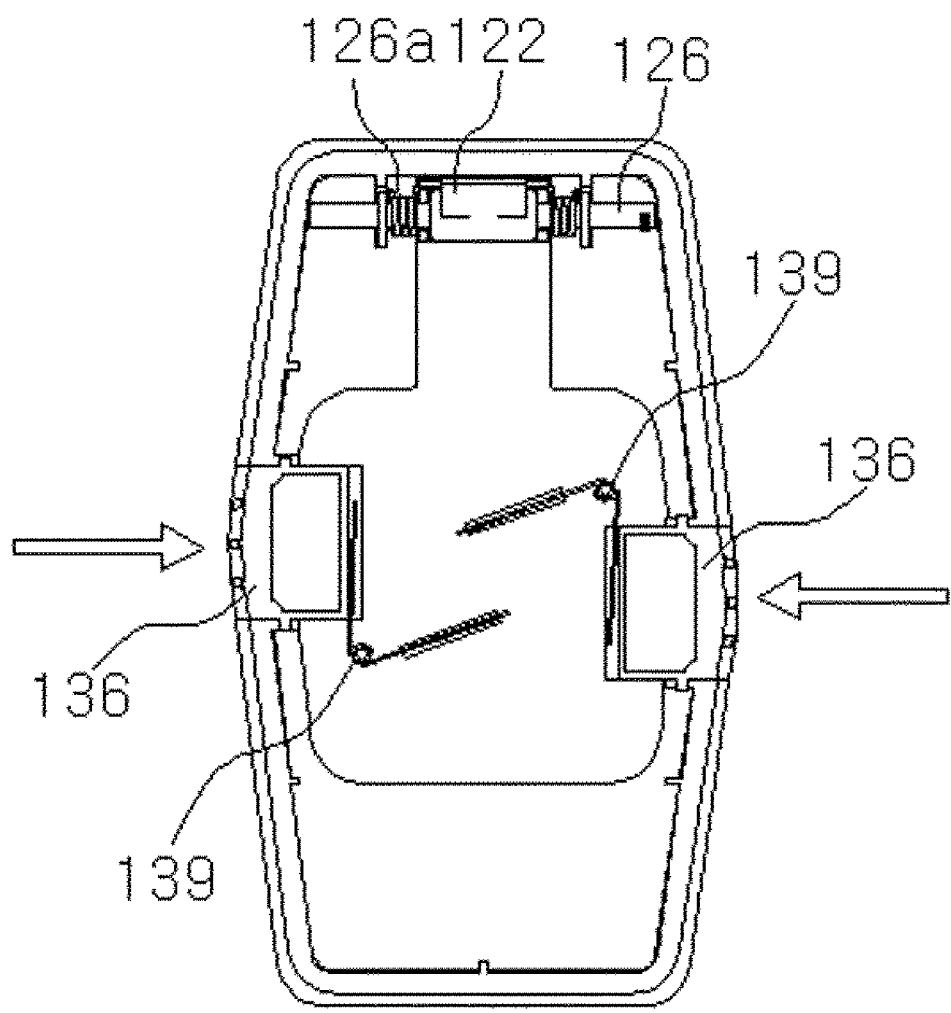
FIGS. 4A and 4B are cross-sectional views taken on line B-B' of FIG. 1.
Figure 4B:
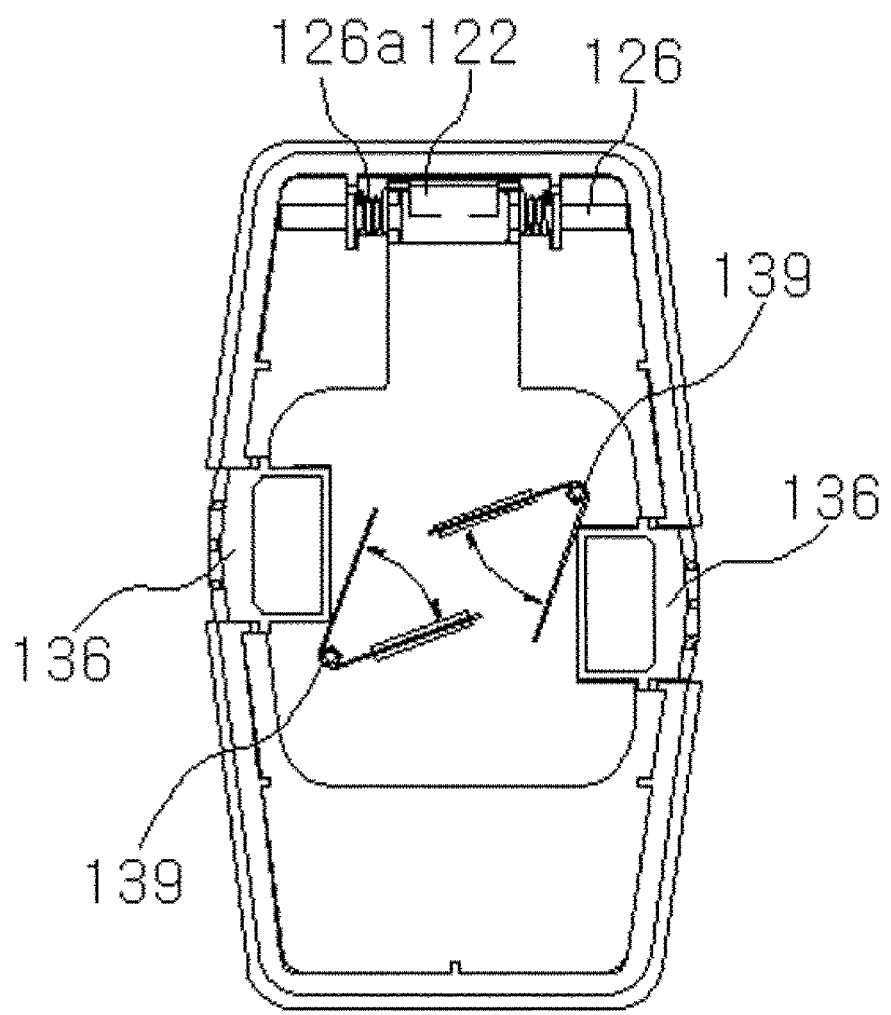
Figure 5A:
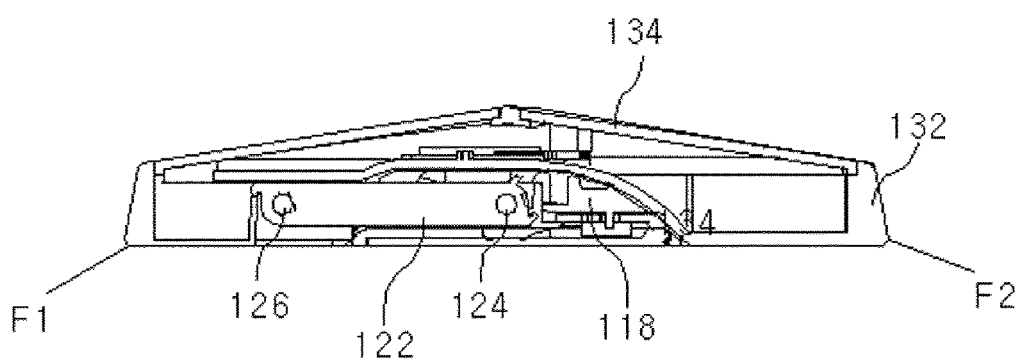
FIGS. 5A to 5C are views illustrating an operation relationship of the stand-holder illustrated in FIG. 1.
Figure 5B:
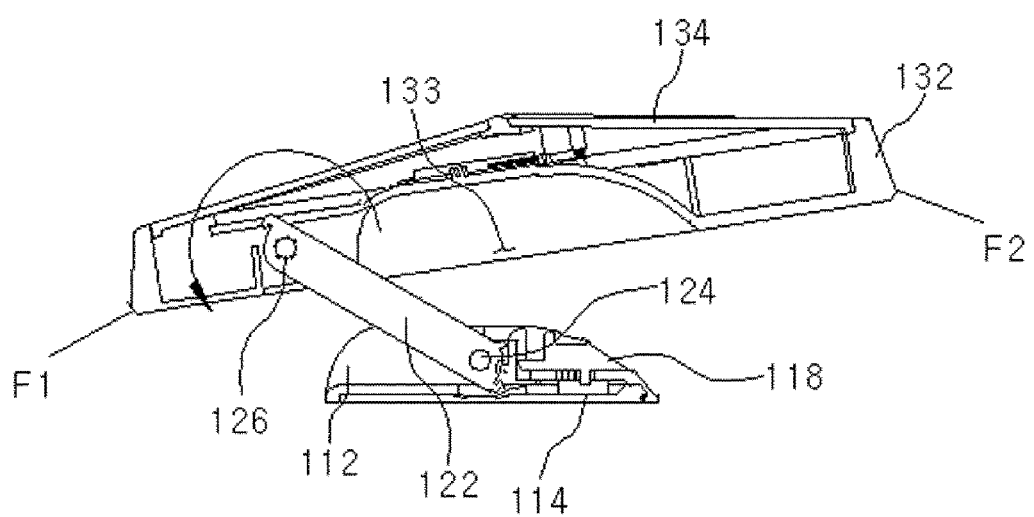
Figure 5C:
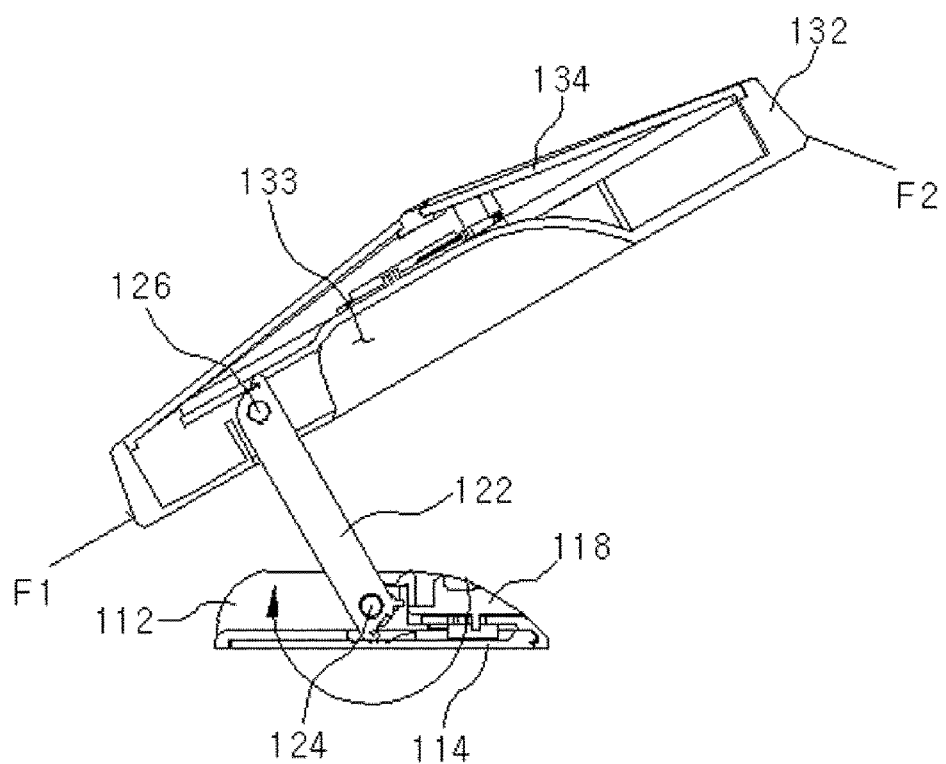
Figure 6:
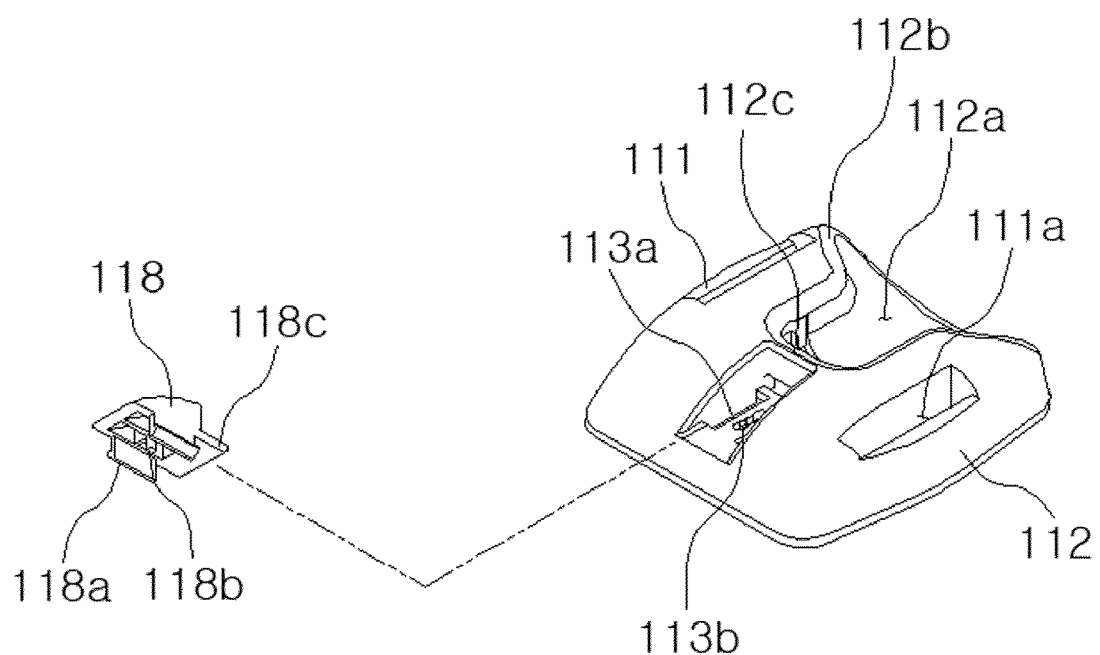
FIG. 6 is a view illustrating a support portion and an angle adjustment member of the stand-holder for the portable terminal according to the present disclosure.
Figure 7A:
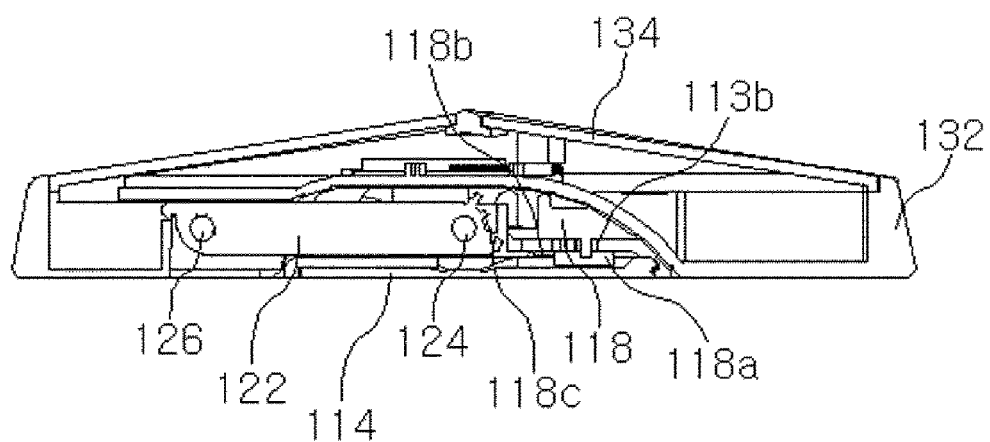
FIGS. 7A, 7B, and 7C are views illustrating a state in which an angle of a coupling portion illustrated in FIG. 1 is adjusted.
Figure 7B:
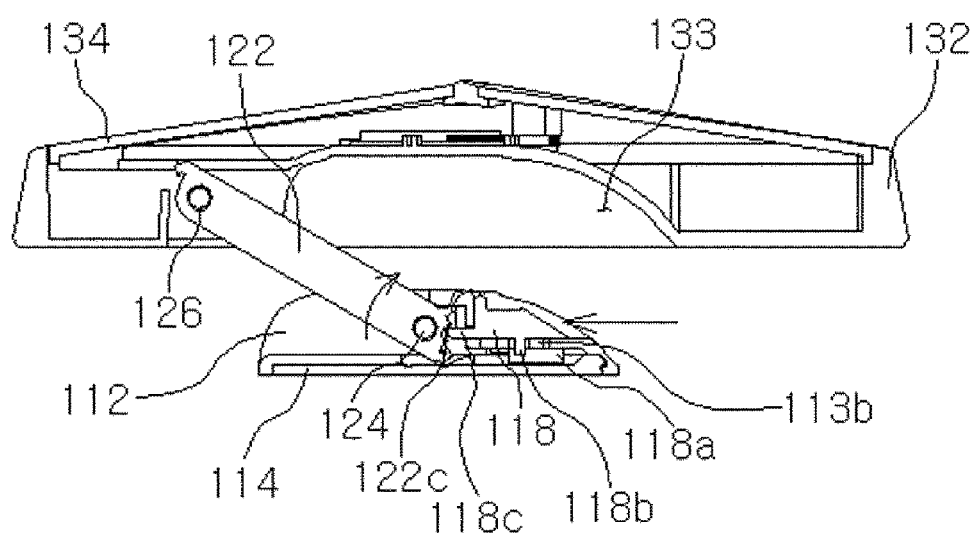
Figure 7C:
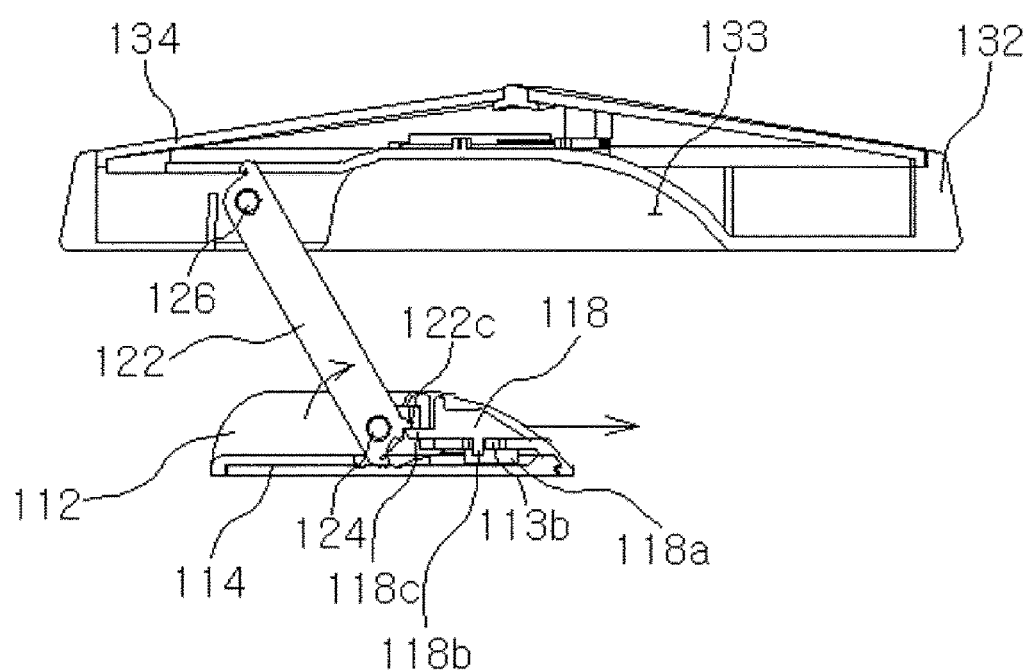

FIG. 1 is a perspective view illustrating a stand-holder for a portable terminal according to the first embodiment of the present disclosure, FIG. 2 is an exploded perspective view of the stand-holder of the first embodiment illustrated in FIG. 1, FIGS. 3A and 3B are cross-sectional views taken on line A-A' of FIG. 1, FIGS. 4A and 4B are cross-sectional views taken on line B-B' of FIG. 1, FIGS. 5A to 5C are views illustrating an operation relationship of the stand-holder of the first embodiment illustrated in FIG. 1, FIG. 6 is a view illustrating a support portion and an angle adjustment member of the stand-holder for the portable terminal according to the first embodiment, FIGS. 7A to 7C are views illustrating a state in which an angle of a coupling portion of the first embodiment illustrated in FIG. 1 is adjusted, and FIGS. 8 to 11 are views illustrating using states of the stand-holder for the portable terminal according to the first embodiment.

According to the first embodiment, the stand-holder for the portable terminal has a foldable structure in the form of "⊥" and thus can have its size adjusted to an optimal size according to a size of a user's finger, and is in contact with both an upper portion and a lower portion of the user's finger, thereby providing a more comfortable and stable grip.

In addition, according to the first embodiment, the stand-holder has the "A"-shaped structure (having one end F1 of a holding portion in contact with a rear surface D of the portable terminal T, and the other end F2 of the holding portion spaced apart from the rear surface of the portable terminal T) by an one-touch operation, such that the portable terminal T can be laid on a floor surface in the landscape or portrait orientation. Accordingly, a user can easily view a video or surf the web through the portable terminal T.

The stand-holder according to the first embodiment may include a support portion 110, a coupling portion 120, and a holding portion 130.

The support portion 110 may be attached to the rear surface D of the portable terminal T, thereby enabling the stand-holder 100 according to the present embodiment to be fixed to the portable terminal T.

According to the first embodiment, the support portion 110 may include a support member 112, a housing 114, and an attaching means 116.

The support member 112 may have a solid shape (for example, a shape having a circular or polygonal cross section) having a predetermined thickness to allow a user's finger to be placed thereon.

The support member 112 may be operatively coupled with the coupling portion 120. For example, the coupling portion 120 may be rotatably coupled with the support member 112. In addition, the support member 112 may be configured to be inserted into a certain space (that is, a support portion receiving recess 133) of the holding portion 130.

The housing 114 may be coupled to a lower surface of the support member 112.

The attaching means 116 may be disposed on a lower surface of the housing 114, and may be attached to the rear surface D of the portable terminal T. For example, the attaching means 116 may include an adhesive, a double-sided tape, or a magnet.

That is, the attaching means 116 may have a lower surface attached to the rear surface D of the portable terminal T, and may have an upper surface coupled to the lower surface of the housing 114, and an upper surface of the housing 114 may be coupled to the lower surface of the support member 112.

The support portion 110 may have a thickness of 0.5 to 1.5 cm, for example. This is to make the user grip the portable terminal T stably and feel a good grip.

A related-art holder for a portable terminal does not have a configuration corresponding to the support portion 110 of the present embodiment, or may be formed to be thin, that is, to have a lower height. In this case, there is no portion to support a tip of a user's finger when the holder is used, and thus the portable terminal is supported only by a force pressing the rear surface of the portable terminal with a bottom surface of the user's finger or user's palm. Therefore, stability deteriorates and it is not easy to operate the portable terminal while gripping the portable terminal.

However, when the tip of the user's finger is supported on the outer surface of the support portion 110 as in the present embodiment, it is possible to grip the portable terminal more stably, and thus it is easier and more stable to operate the portable terminal while gripping the portable terminal. In addition, there is an advantage that a thumb's reachable range on a display of the portable terminal increases.

The support member 112 may have a receiving recess 112a formed on the upper surface thereof, and the receiving recess 112a may be formed on the upper surface of the support member 112 in a longitudinal direction. The receiving recess 112a may be configured to receive a coupling member 122 of the coupling portion 120 when the coupling member 122 is folded, and accordingly, the thickness of the stand-holder 100 according to the present embodiment can be reduced.

A stop projection 112c may be formed at a rear end of the receiving recess 112a. When the coupling member 122 of the coupling portion 120 is unfolded (that is, in the unfolded state), an unfolding angle may be determined by the stop projection 112c. That is, the coupling member 122 is not unfolded by more than a predetermined angle by the stop projection 112c.

The coupling portion 120 has a structure having a predetermined length, and couples the support portion 110 and the holding portion 130 to each other. The coupling portion 120 may have one end operatively coupled with the support portion 120 to be rotatable relative to the support portion 110, and the other end operatively coupled with the holding portion 130 to be rotatable relative to the holding portion 130.

In the unfolded state, the coupling portion 120 may be configured to maintain a predetermined distance between the support portion 110 and the holding portion 130, and to allow a finger to be inserted between the support portion 100 and the holding portion 130. Due to this configuration, the stand-holder of the present embodiment may serve as a holder and a stand.

The coupling portion 120 may include the coupling member 122 and first and second pivoting members 124, 126.

The coupling member 122 may maintain the support portion 110 and the holding portion 130 spaced apart from each other by a predetermined distance.

The first and second pivoting members 124, 126 are coupled to both ends (hereinafter, referred to as a first end and a second end) of the coupling member 122 to make the coupling member 122 rotatable.

The first pivoting member 124 couples the first end of the coupling member 122 and the support portion 110 to enable the first end of the coupling member 122 and the support portion 110 to be rotated relative to each other. In the present embodiment, the first pivoting member 124 is coupled by means of a hinge to allow the coupling member 122 to rotate in a direction perpendicular to the longitudinal direction of the coupling member 122.

The second pivoting member 126 couples the second end of the coupling member 122 and the holding portion 130 to enable the second end of the coupling member 122 and the holding portion 130 to be rotated relative to each other. In the present embodiment, the second pivoting member 126 is coupled by means of a hinge to allow the coupling member 122 to rotate in the direction perpendicular to the longitudinal direction of the coupling member 122.

That is, the first end of the coupling member 122 is coupled to the support portion 110 by means of a hinge to be rotated about the first pivoting member 124, and the second end of the coupling member 122 is coupled to the holding portion 130 by means of a hinge to be rotated about the second pivoting member 125.

Specifically, the first pivoting member 124 is coupled to cross the receiving recess 112a on one end of the support member 112 of the support portion 110, and is coupled to the first end of the coupling member 122 in a direction perpendicular to the longitudinal direction of the coupling member 122.

The second pivoting member 126 is rotatably coupled to the holding portion 130, and is coupled to the second end of the coupling member 122 in the direction perpendicular to the longitudinal direction of the coupling member 122.

The first pivoting member 124 and the second pivoting member 125 may have the same structure and the same function, and the coupling member 122 may be folded in the receiving recess 112a, or may be unfolded toward the outside of the receiving recess 112a, that is, may be erected from the support portion 110 by the first pivoting member 124, and the holding portion 130 may be folded or unfolded by the second pivoting member 126.

The first and second pivoting members 124, 126 in the present embodiment are exemplary and a person skilled in the art can easily use other coupling means for rotatably coupling the coupling member 122 to the support portion 110 and the holding portion 130.

Although will be described below, the holding portion 130 is rotated with reference to the second pivoting member 126, such that an upper portion of the holding portion 130 moves toward the rear surface of the portable terminal, and a lower portion of the holding portion 130 moves away from the rear surface of the portable terminal. According to this configuration, the stand-holder for the portable terminal according to the present embodiment may have the "A"-shaped structure or the "seesaw" structure in the unfolded state.

According to the "A"-shaped structure or the "seesaw" structure, when a user's finger is positioned on the support portion 110, the upper side of the holding portion 130, specifically, the upper side of a holding member 132, presses the finger, such that the user can comfortably and tightly grip the portable terminal while operating the portable terminal.

In the present embodiment, the support member 112 has a seating recess 112b formed on the upper surface thereof, on which the receiving recess 112a is formed. The user's finger is positioned on the seating recess 112b. The seating recess 112b in the present embodiment has a shape to allow the user's finger to be stably seated thereon, and to allow the user to tightly grip the portable terminal.

As described above, when the holding portion 130 is rotated with reference to the second pivoting member 126, the stand-holder has the "seesaw" structure in which the upper portion of the holding portion 130 presses the user's finger, and the lower portion of the holding portion 130 is spaced apart from the rear surface D of the portable terminal T, and accordingly, the user can stably and comfortably use the portable terminal T.

According to the present embodiment, the support portion 110 may further include an angle adjustment member 118 to adjust a pivoting angle of the coupling portion 120. A distance between the support portion 110 and the holding portion 130 may be adjusted by the angle adjustment member 118.

To grip the portable terminal, the user should insert user's fingers into a space between the support portion 110 and the holding portion 130. A comfortable distance between the support 110 and the holding portion 130 that the user feels may vary according to thickness of user's finger. Considering this situation, the present embodiment provides a function of adjusting the pivoting angle of the coupling portion 120 in phases by the angle adjustment member 118.

In the present embodiment, the angle adjustment member 118 includes a fixing piece 118a, a locking portion 118b, and a support protrusion 118c. The fixing piece 118a is coupled to a coupling hole 113a formed on the support member 112, and the locking portion 118b is coupled to a locking recess 113b formed on the support member 112.

In the present embodiment, the coupling hole 113a and the locking recess 113b may be formed in a long hole shape, and may be configured to allow the angle adjustment member 118 to move forward and backward, and the locking recess 113b is formed to have multiple steps. The user may position the locking portion 118b of the angle adjustment member 118 on a desired position of the multiple steps.

The support protrusion 118c may protrude from a front end of the angle adjustment member 118 to support the coupling portion 120, and accordingly, the angle adjustment member 118 is moved, thereby adjusting the pivoting angle of the coupling portion 120.

In the present embodiment, multi-stage support projections 122c corresponding to the support protrusion 118c are formed at an end of the coupling member 122 of the coupling portion 120 beside the support portion 110. Accordingly, the support protrusion 118c of the angle adjustment member 118 is supported on one of the support projections 122c of the coupling member 122 according to a movement of the angle adjustment member 118, and accordingly, the pivoting angle of the coupling member 122 is adjusted. As a result, the user can adjust the distance between the support portion 110 and the holding portion 130 to suit to thickness of user's finger.

The holding portion 130 is rotatably coupled to the other end of the coupling portion 120. When the user grips the portable terminal with user's fingers, the holding portion 130 presses outer surfaces of the user's fingers toward the rear surface of the portable terminal, thereby allowing the user to maintain a stable grip, and, when the user does not grip the portable terminal, the holding portion 130 is supported on a floor surface and serves to stand the portable terminal in the landscape or portrait orientation.

According to the present embodiment, the holding portion 130 includes the holding member 132 and a case 134.

In the present embodiment, the second pivoting member 126 of the coupling portion 120 is coupled to an inside of the holding portion 130, that is, a portion of the holding portion 130 facing the support portion 110, by means of a hinge.

The holding member 132 includes the support portion receiving recess 133 to receive the support portion 110 therein with the coupling member 122 being folded.

The case 134 is for covering an upper surface of the holding member 132.

According to the present embodiment, as shown in FIGS. 1 and 3A and 3B, the support member 112 of the support portion 110 is received in the support portion receiving recess 133 formed inside the holding portion 130, such that a volume of the stand-holder in the folded state of the coupling member 122 can be minimized.

Referring to FIG. 2, the coupling portion 120 includes a first torsion spring 140 and a second torsion spring 126a. These torsion springs 126a, 140 are for rotating the pivoting members in a predetermined direction. The torsion springs 126a, 140 may be configured to rotate the pivoting members in a predetermined direction (to make the "A"-shaped structure or the "seesaw" structure) unless an external force is applied by the user.

The second torsion spring 126a is operatively coupled to the second pivoting member 126. That is, as shown in FIG. 5B, the second torsion spring 126a rotates the second pivoting member 126, such that the front end F1 of the holding portion 130 is rotated in the direction to come into contact with the rear surface of the portable terminal, and the rear end F2 of the holding portion 130 is rotated in the direction to be spaced further apart from the rear surface of the portable terminal.

Referring back to FIG. 2, the first torsion spring 140 is operatively coupled to the first pivoting member 124. That is, the first torsion spring 140 rotates the first pivoting member 124 in the direction to erect the coupling member 122 as shown in FIG. 5C.

As described above, the unfolded state of the stand-holder for the portable terminal according to the present embodiment is a state where the coupling member 122 is erected by the first torsion sprint 140, and the front end of the holding portion 130 is in contact with the rear surface of the portable terminal, and the rear end of the holding portion 130 is spaced apart from the rear surface of the portable terminal by the second torsion spring 126a.

In the present embodiment, the holding portion 130 is provided with a button 136 formed on one side or both sides thereof, and the button 136 may support the support portion 110 being inserted into the holding portion 130, or may decouple the support portion 110 and the holding portion 130 from each other.

The button 136 includes a locking protrusion 138 having a first locking projection 138a formed thereon.

The locking protrusion 138 is formed on one side of the button 136, and the locking protrusion 138 is coupled to a coupling hole 132a formed on the holding member 132 of the holding portion 130 by penetrating therethrough.

The first locking projection 138a is formed at an end of the locking protrusion 138.

The support member 112 of the support portion 110 has a coupling recess 111 formed thereon to allow the locking protrusion 138 to be inserted thereinto, and a second locking projection 111a corresponding to the first locking projection 138a is formed on the coupling recess 111.

In the present embodiment, the button 136 is elastically supported by a third torsion spring 139 provided in the holding member 132, and the first locking projection 138a and the second locking projection 111a is not arbitrarily disengaged from each other, and the first locking projection 138a and the second locking projection 111a are disengaged from each other only when the button 136 is pressed by an external force.

In the folded state of the stand-holder for the portable terminal according to the present embodiment as shown in FIG. 3A, the first locking projection 138a and the second locking projection 111a are engaged with each other and the coupling state of the holding portion 130 and the support portion 110 is maintained.

When the button 136 is pressed, the first locking projection 138a and the second locking projection 111a are disengaged from each other, and the stand-holder is in the unfolded state, and as shown in FIGS. 5B and 5C, the coupling member 122 is automatically unfolded.

When the support portion 110 and the holding portion 130 are decoupled from each other, the stand-holder for the portable terminal according to the present embodiment is in the unfolded state. That is, when the support portion 110 and the holding portion 130 are decoupled from each other, the coupling member 122 is erected, and the front end of the holding portion 130 comes into contact with the rear surface of the portable terminal and the rear end of the holding portion 130 is spaced apart from the rear surface of the portable terminal.

Hereinafter, an operation relationship of the stand-holder 100 according to the first embodiment of the present disclosure will be described in detail with reference to the accompanying drawings.

When the stand-holder 100 for the portable terminal according to the present embodiment is used as a holder for the portable terminal, the stand-holder is attached and fixed to the rear surface of the portable terminal by the attaching means 116 of the support portion 110, as shown in FIGS. 3A and 3B and FIGS. 5A to 5C.

The stand-holder 100 for the portable terminal according to the present embodiment maintains the folded state unless the button 136 is pressed by the user.

The folded state refers to a state where the coupling member 122 is folded in the receiving recess 112a by fixing the support portion 110 and the holding portion 130 by means of the button 136, and the support portion 110 is folded and received in the support portion receiving recess 133 of the holding portion 130.

When the user presses the button 136 of the holding portion 136, the stand-folder 100 for the portable terminal according to the present embodiment maintains the unfolded state.

The unfolded state refers to a state where the first locking projection 138a of the button 136 is disengaged from the second locking projection 111a of the support member 112, and the coupling member 122 is automatically unfolded by a torsion of the first torsion spring 140 coupled to the first pivoting member 124, and the support portion 110 and the holding portion 130 is spaced apart from each other.

According to the present embodiment, the support portion 110 and the holding portion 130 fixed to each other are decoupled from each other only by the user's pressing the button 136, and the coupling member 122 is unfolded, and accordingly, the user can easily hold the portable terminal.

Figure 8:
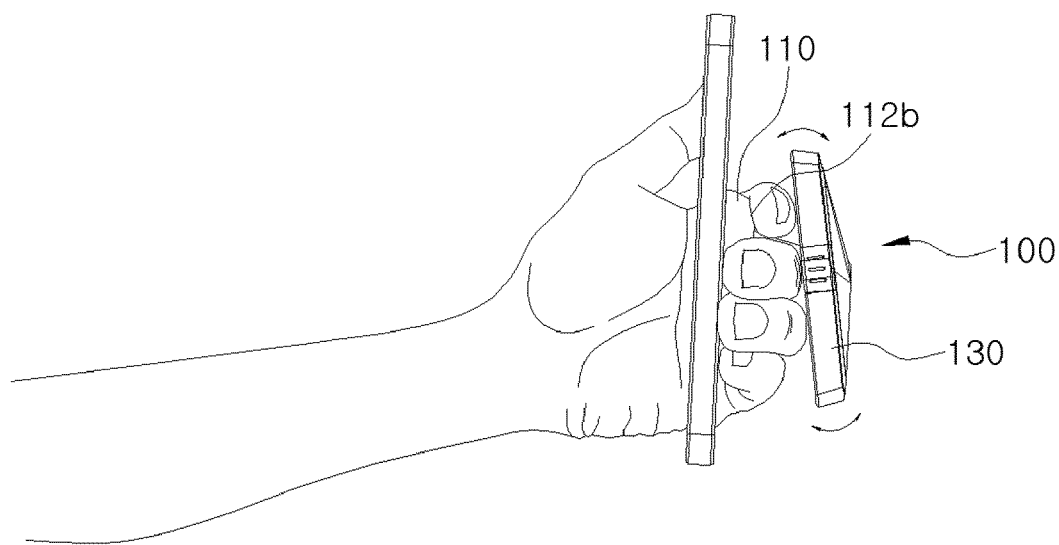
FIGS. 8, 9, 10, and 11 are views illustrating using states of the stand-holder for the portable terminal according to the present disclosure.

In this state, the user grips the portable terminal by inserting user's fingers into the space between the support portion 110 and the holding portion 130. As shown in FIG. 8, the user inserts user's fingers to have the palm face the support portion 110 and to have the coupling member 122 inserted between user's index and middle fingers or between user's index and ring fingers.

In this case, since there is a difference in the distance between the support portion 110 and the holding portion 130 enabling the user to grip the portable terminal comfortably easily according to thickness of user's finger, the distance between the support portion 110 and the holding portion 130 may be adjusted to allow the user to grip the portable device more comfortably and more stably according to the present disclosure. The distance between the support portion 110 and the holding portion 130 may be adjusted by adjusting the pivoting angle of the coupling member 122 by the angle adjustment member 118.

That is, as shown in FIGS. 7A to 7C, the distance between the support portion 110 and the holding portion 130 may be adjusted by adjusting the position of the support protrusion 118c to be supported one of the support projections 122c of the coupling member 122 by moving the angle adjustment member 118.

The user uses the portable terminal in the grip state as described above. In the present disclosure, the support portion 110 is formed to have a predetermined thickness and thus protrudes from the rear surface of the portable terminal. Accordingly, a tip of a user's finger is caught on the outer surface of the support portion 110, that is, on the seating recess 112b, and thus the user can apply a force. Therefore, the user can feel a more comfortably grip. In addition, when the user operates the portable terminal with one hand using user's thumb, the stable grip state can be maintained, and also, a thumb's reachable range on the portable terminal is enlarged.

In addition, when the user operates the portable terminal while gripping the same, the holding portion 130 forming the seesaw structure with the pivoting members presses the upper portions of the user's fingers, such that the user can maintain the grip state more stably and can reduce the risk of dropping the portable terminal while operating the portable terminal.

When the stand-holder 100 for the portable terminal according to the first embodiment is not used as a stand or a holder, the stand-holder 100 for the portable terminal may be maintained in the folded state.

To fold the stand-holder 100, the coupling member 122 is received in the receiving recess 112a formed on the support portion 110 by rotating the holding portion 130, and the support portion 110 is received in the support portion receiving recess 133 of the holding portion 130. In this case, the first locking projection 138a of the button 136 is engaged with and fixed to the second locking projection 111 of the support member 112, and as shown in FIG. 3A, the coupling member 122 is received in the receiving recess 112a, and the support portion 110 is received in the support portion receiving recess 133 of the holding portion 130 and is maintained therein. Accordingly, in the folded state, the volume of the sand-holder 100 for the portable terminal according to the present embodiment can be minimized.

Figure 9:
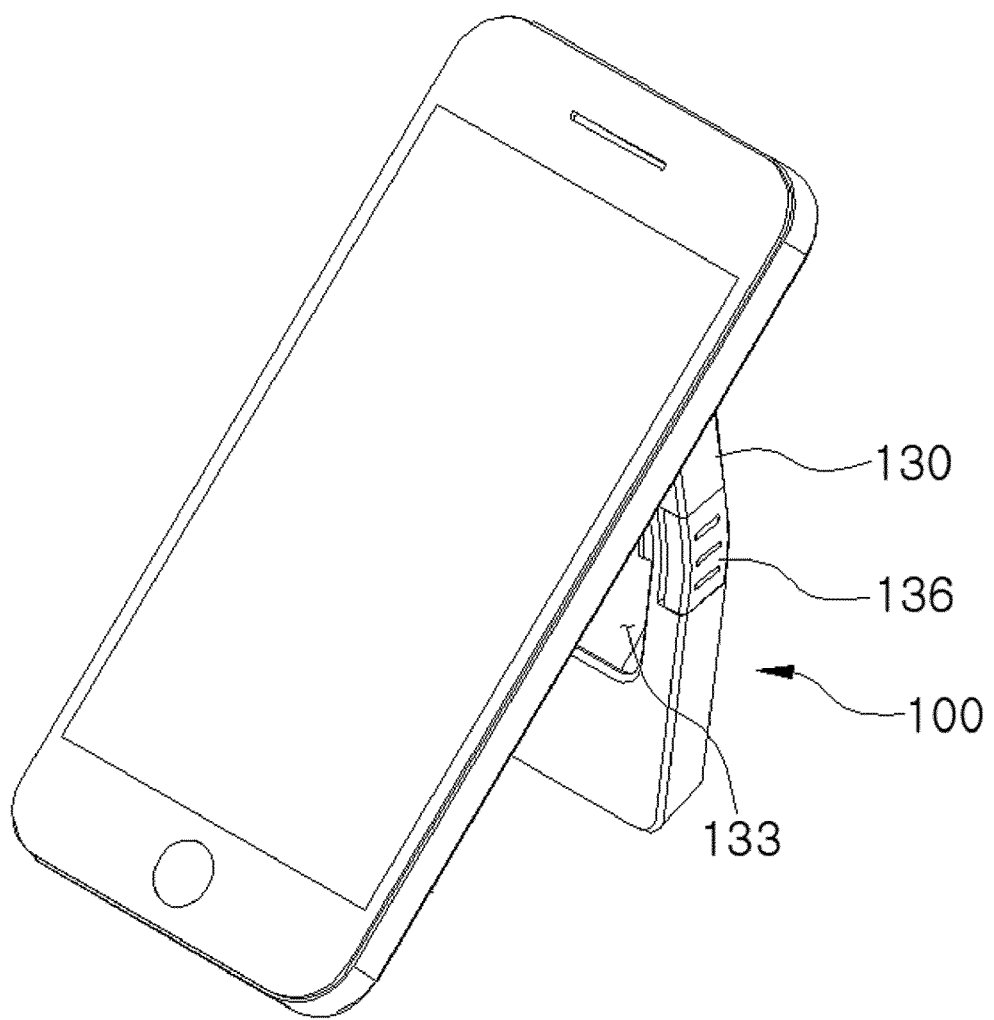

As shown in FIGS. 9 and 10, when the stand-holder 100 according to the present disclosure is used as a stand for the portable terminal, the portable terminal can be made to stand simply by unfolding the coupling member 122.

That is, when the user presses the button 136, the coupling member 122 is automatically unfolded by the torsion of the second torsion spring 126a, and the front end of the holding portion 130 comes into contact with the rear surface of the portable terminal. Therefore, the portable terminal can be made to stand on a floor surface without an additional operation.

Second Embodiment

Hereinafter, a stand-holder 200 for a portable terminal according to the second embodiment of the present disclosure will be described with reference to FIGS. 12 to 34.

Figure 12:
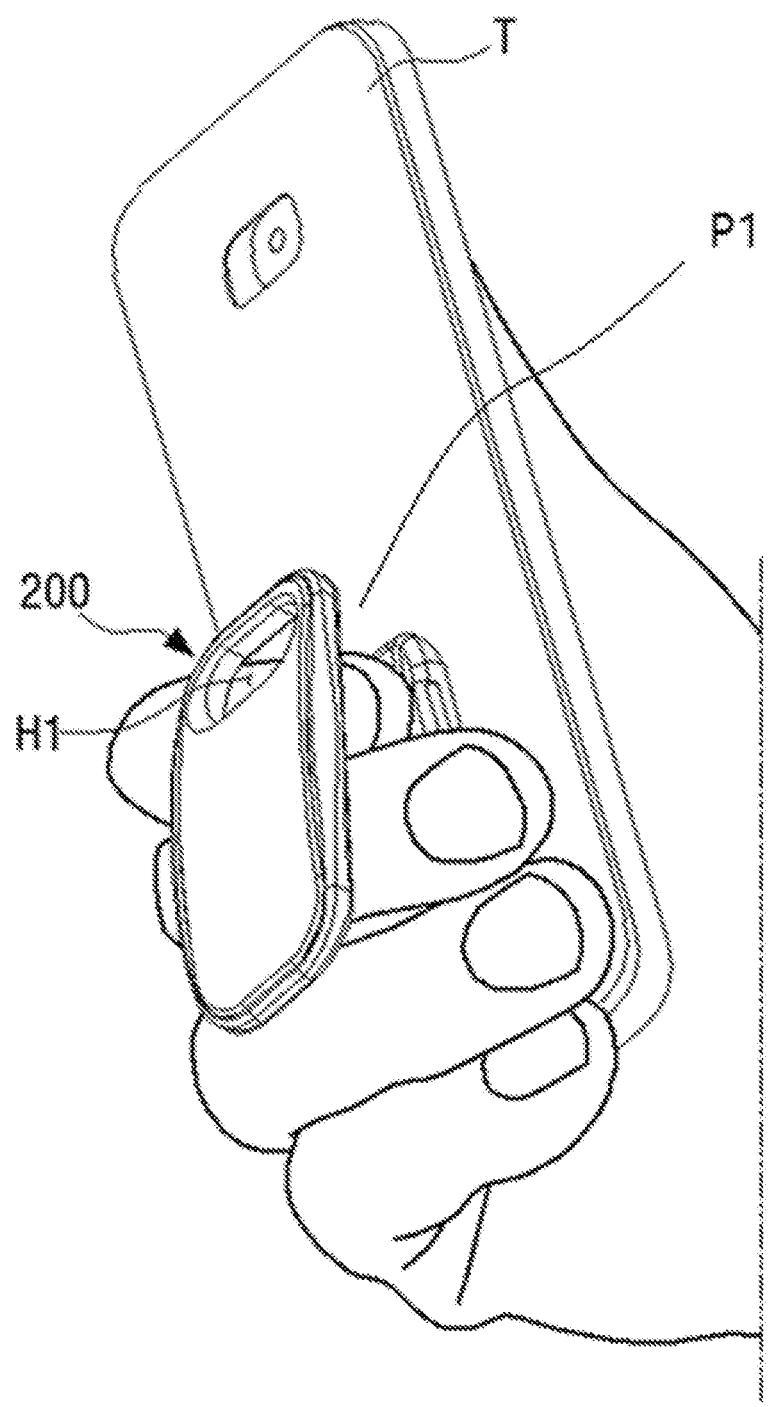
FIG. 12 is a view illustrating a stand-holder 200 for a portable terminal when the stand-holder is used as a holder according to a second embodiment of the present disclosure.
Figure 13:
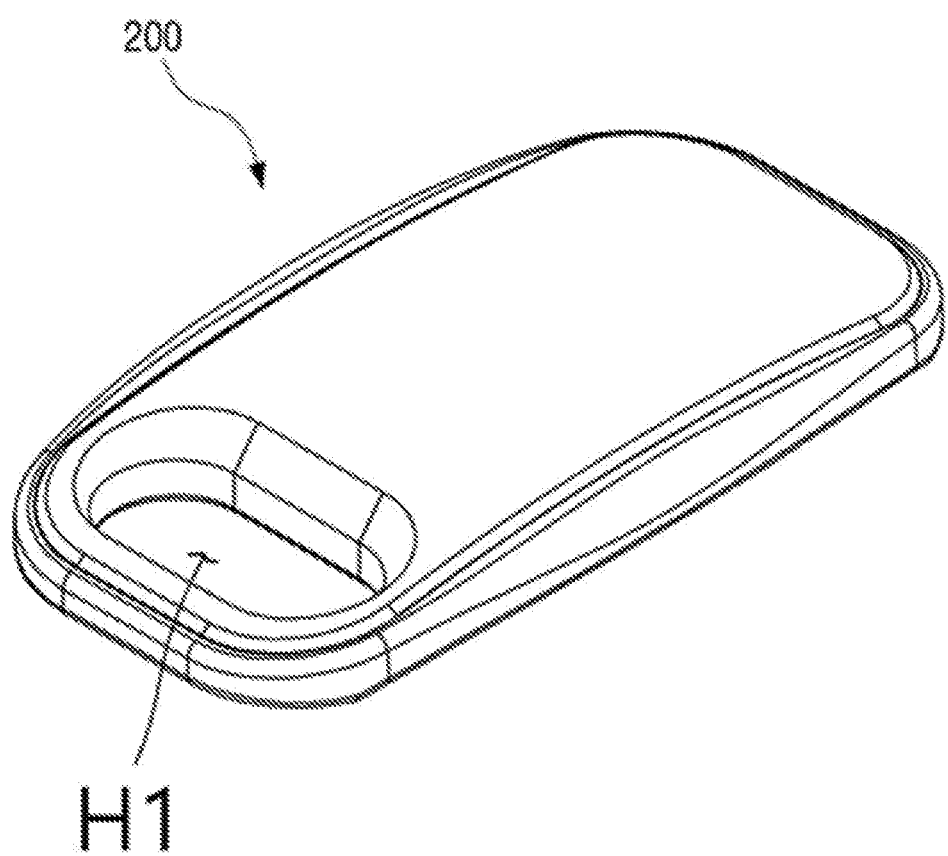
FIG. 13 is a perspective view of the stand-holder of the second embodiment.
Figure 14:
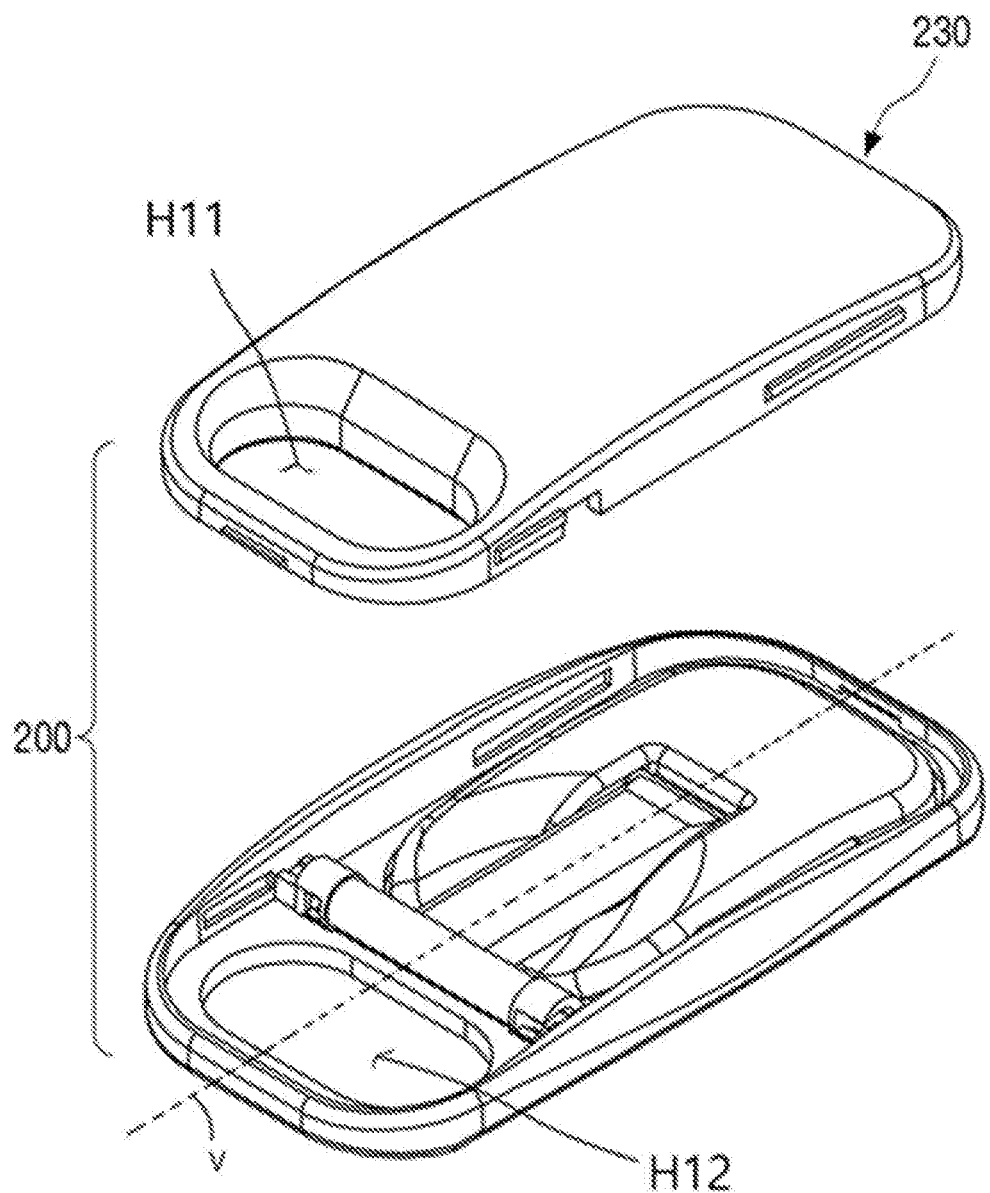
FIG. 14 is a view illustrating a holding portion and a case which are decoupled from each other according to the second embodiment.
Figure 15:
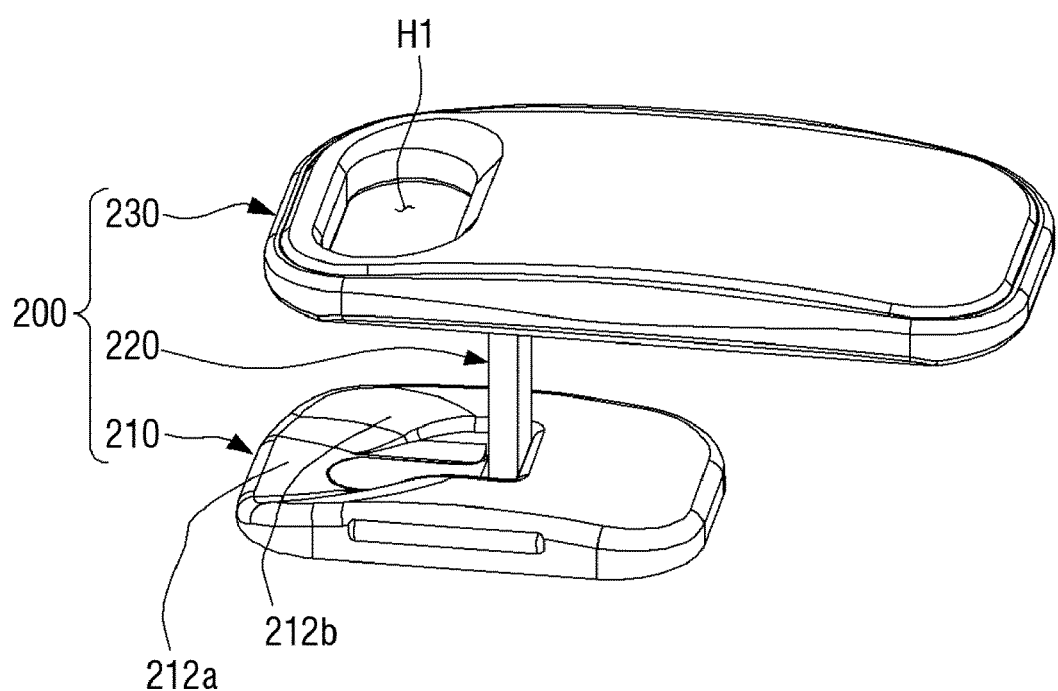
FIG. 15 is a view illustrating a state in which a coupling portion of the second embodiment is erected for convenience of explanation.
Figure 16:
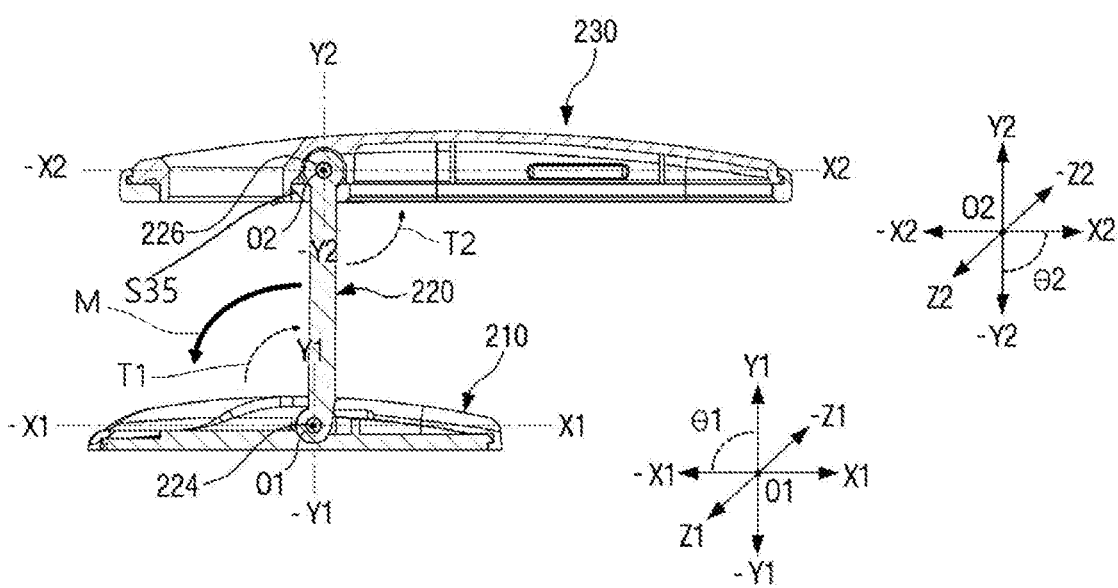
FIG. 16 is a cross-sectional view of the stand-holder of the second embodiment illustrated in FIG. 15.
Figure 18:
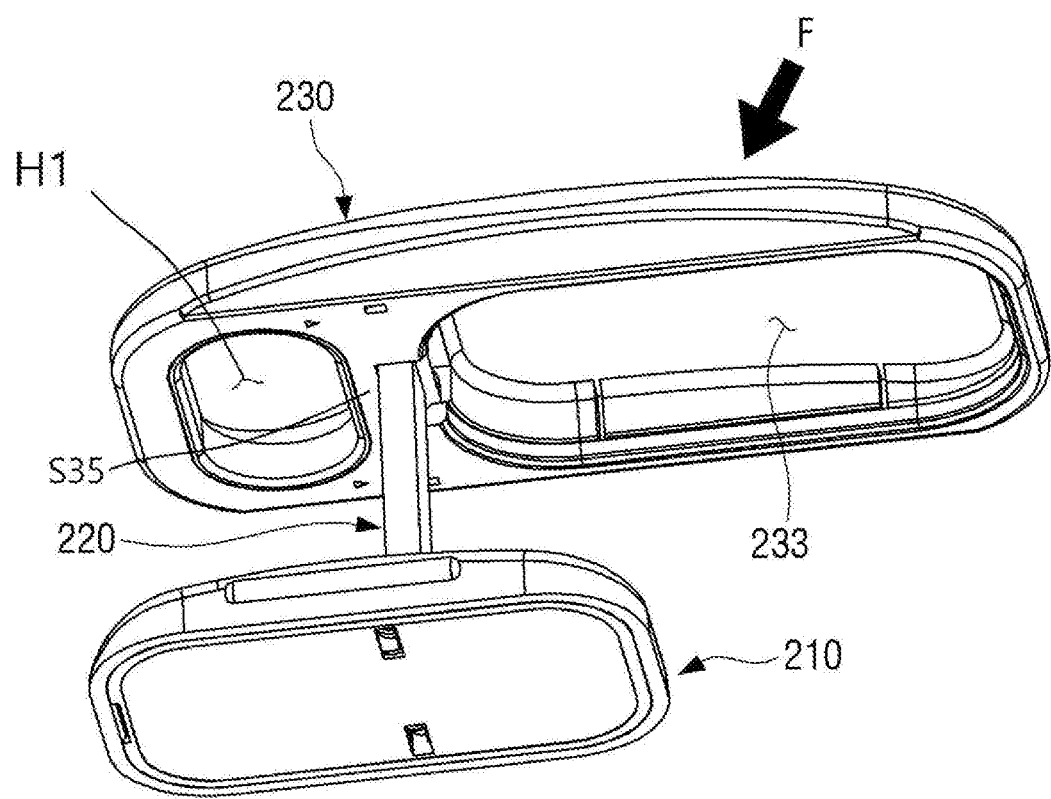
FIG. 18 is a view illustrating the stand-holder of the second embodiment of FIG. 15 as viewed from the bottom.
Figure 19:
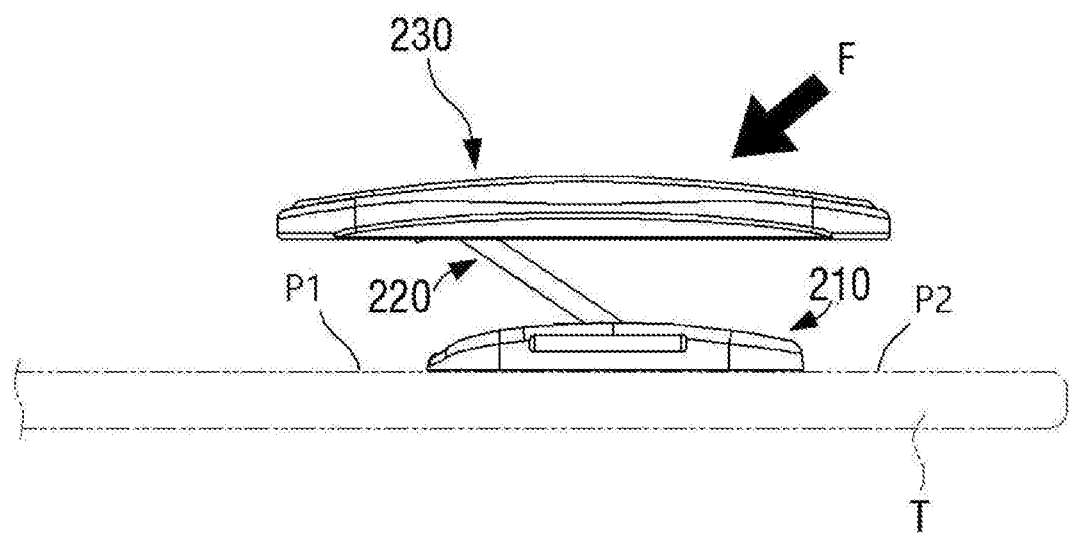
FIG. 19 is a view to illustrating switchover from an unfolded state to a folded state according to the second embodiment.
Figure 20:
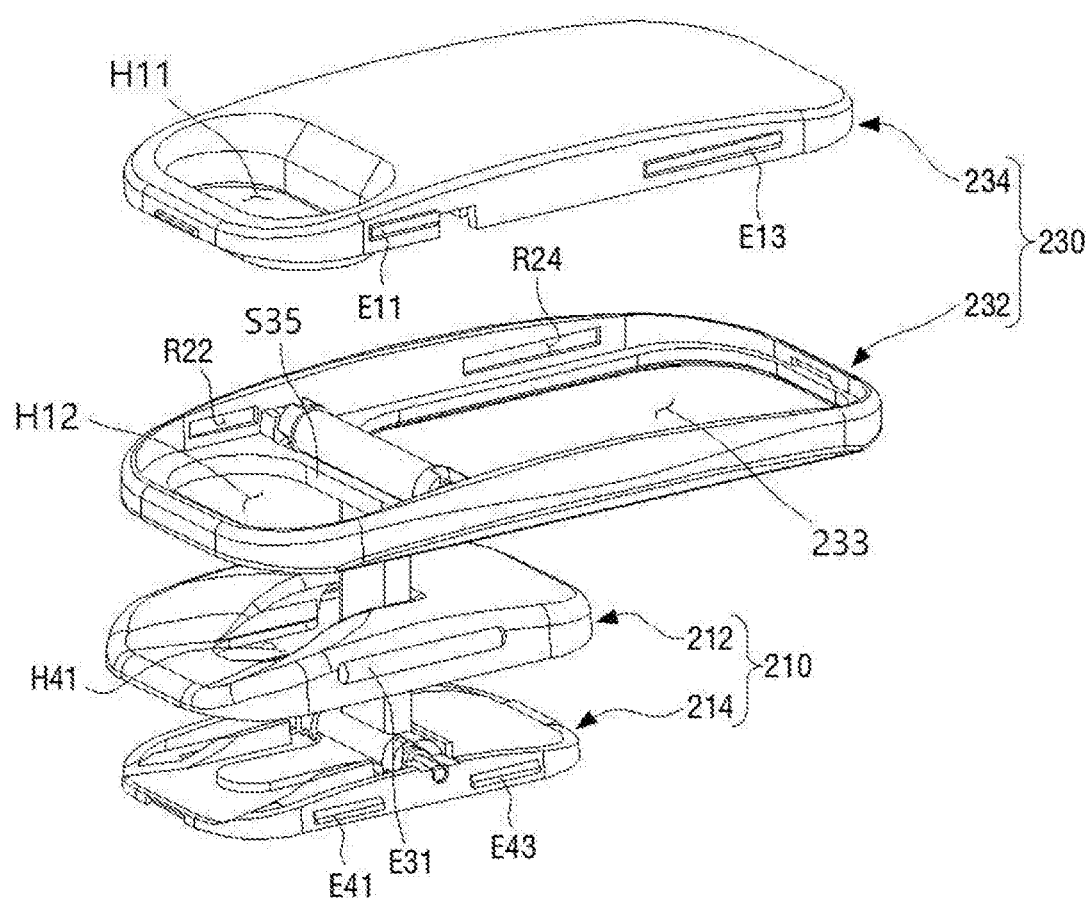
FIG. 20 is an exploded perspective view of the stand-holder of the second embodiment.
Figure 21:
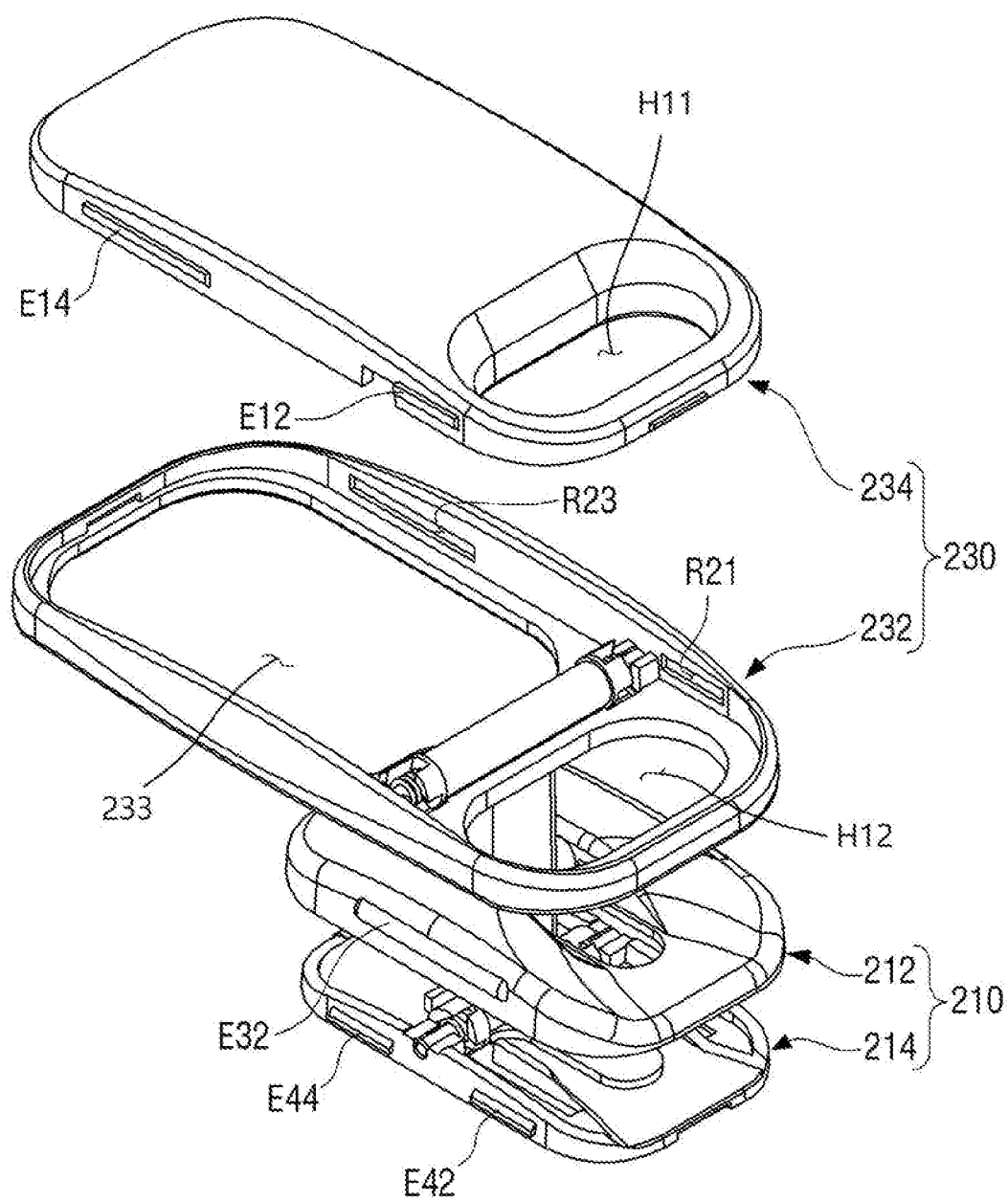
FIG. 21 is a view illustrating the stand-holder of the second embodiment of FIG. 20 as viewed from a different angle.
Figure 22:
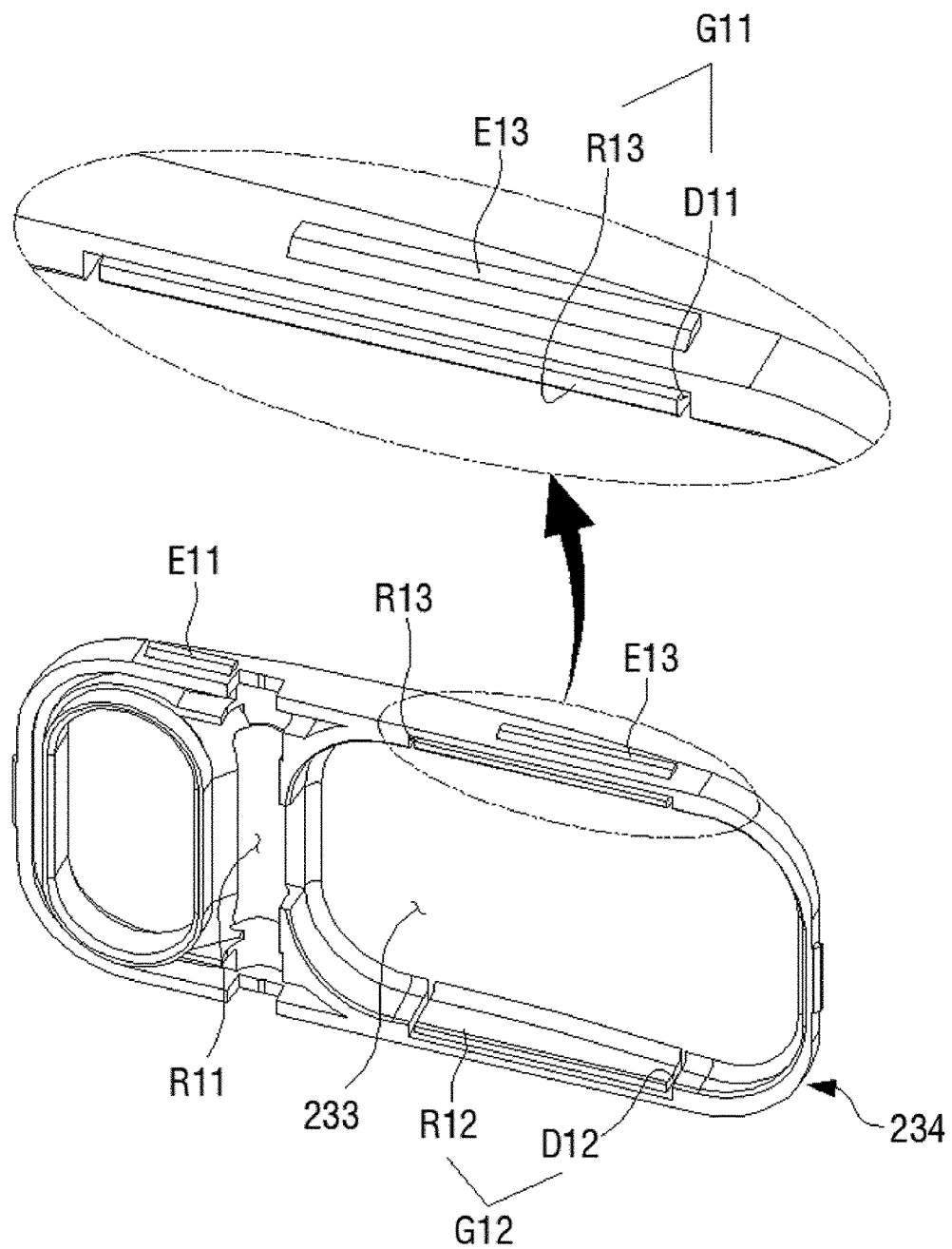
FIG. 22 is a view illustrating a holding portion of the second embodiment as viewed from the bottom.
Figure 23:
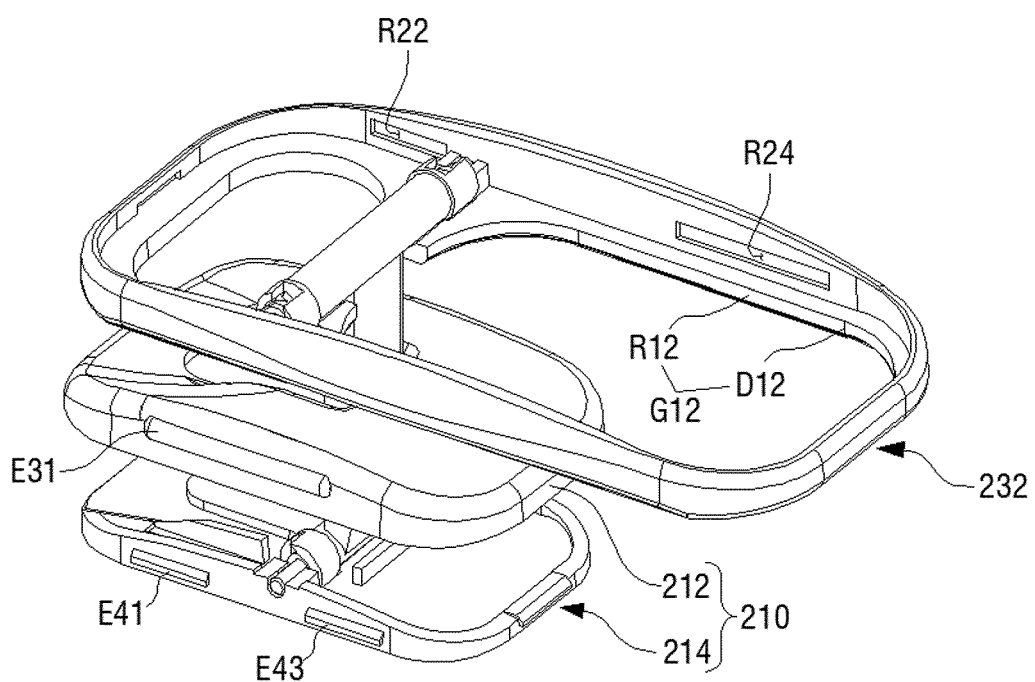
FIGS. 23, 24, 25, 26, 27, 28, 29, 30, 31, 32, 33, and 34 are views illustrating the stand-holder of the second embodiment with some elements omitted or enlarged.
Figure 24:
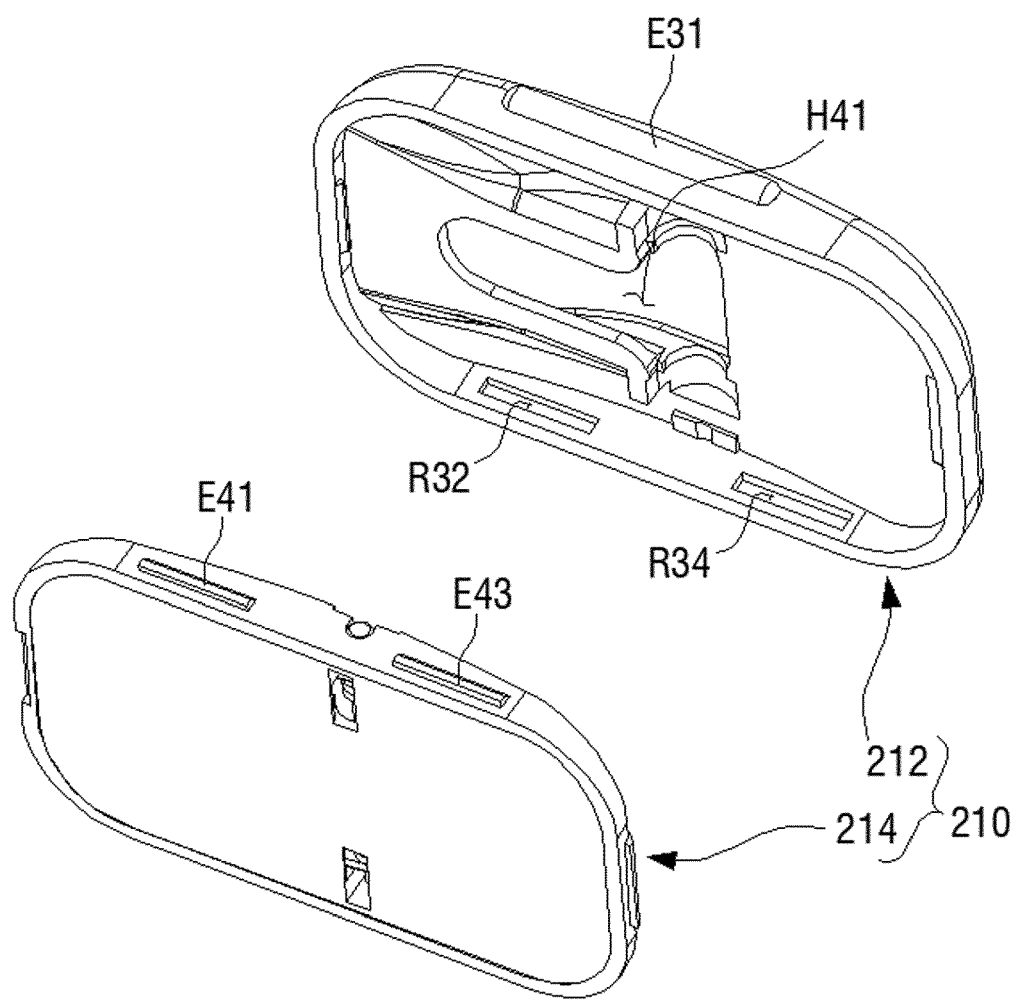
Figure 25:
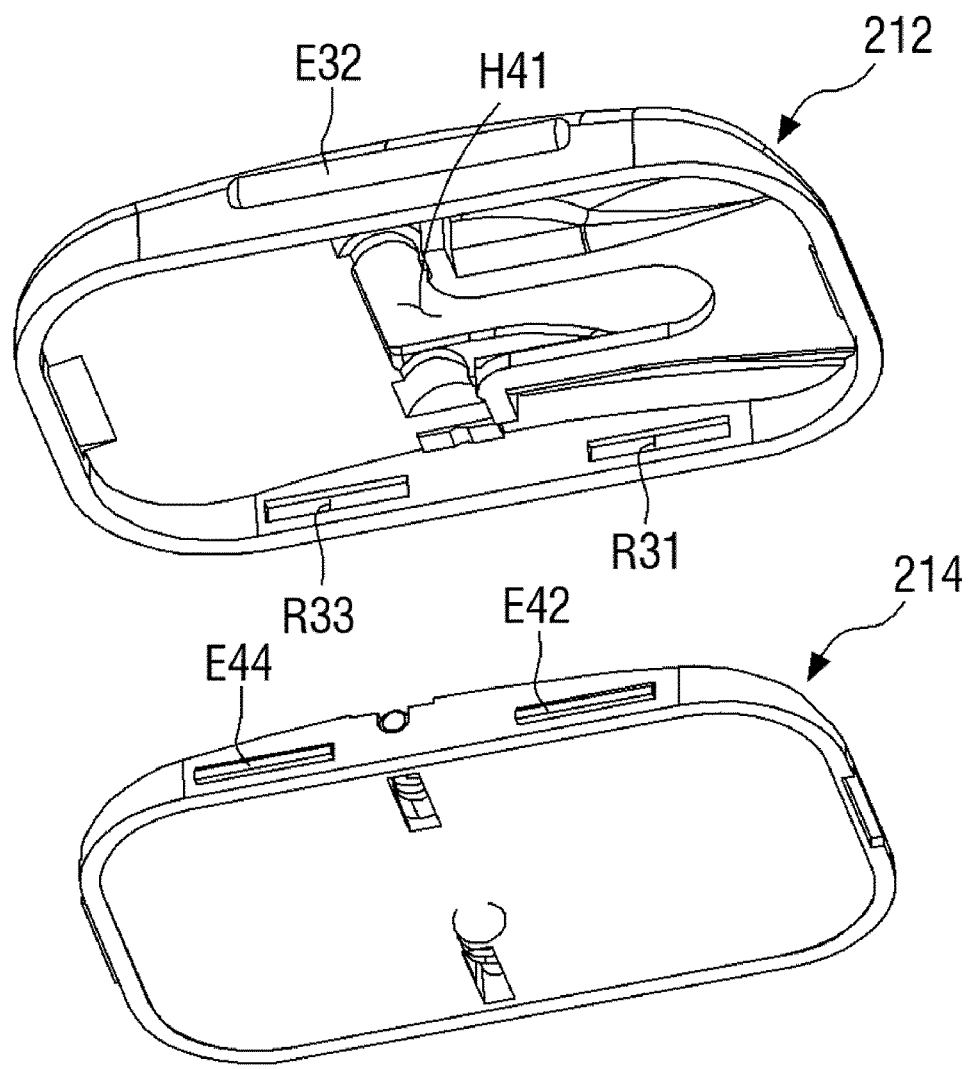
Figure 26:
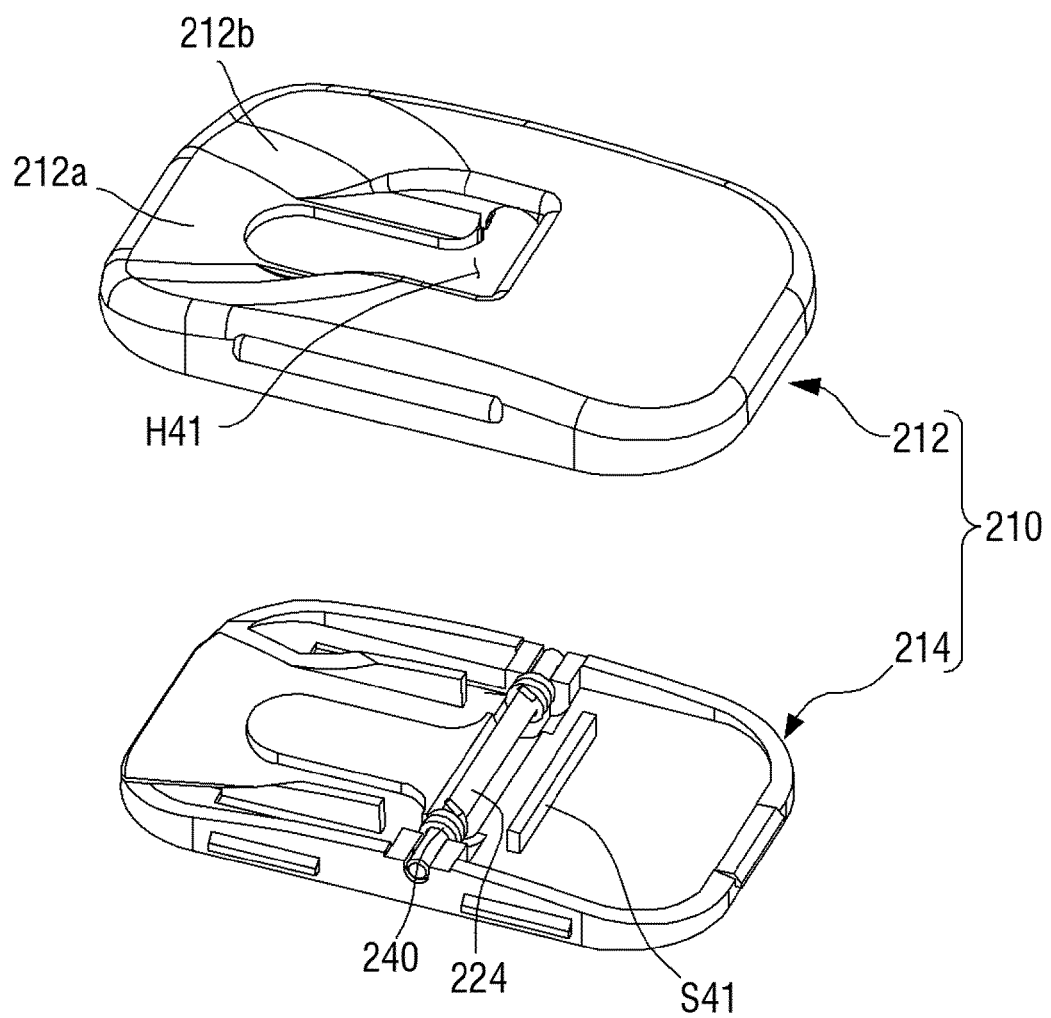
Figure 27:
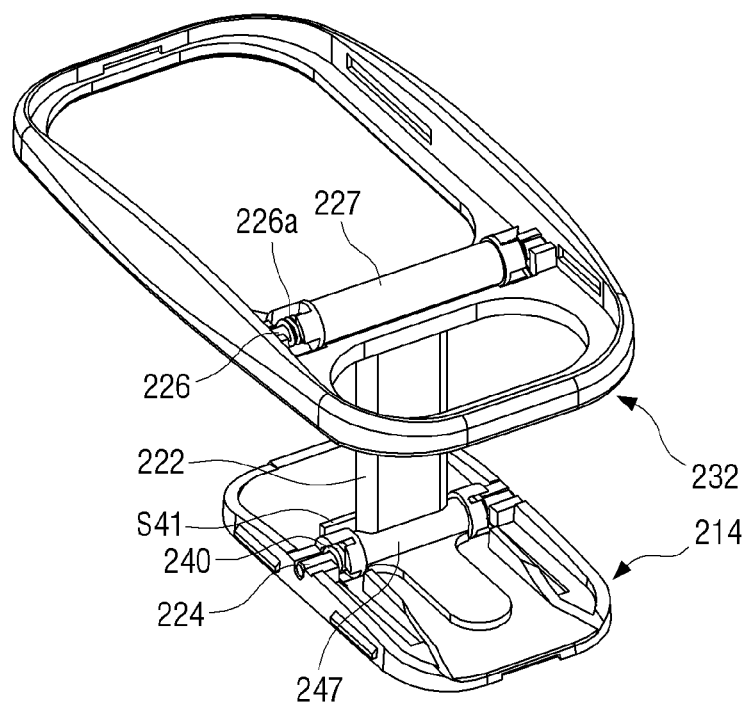
Figure 28:
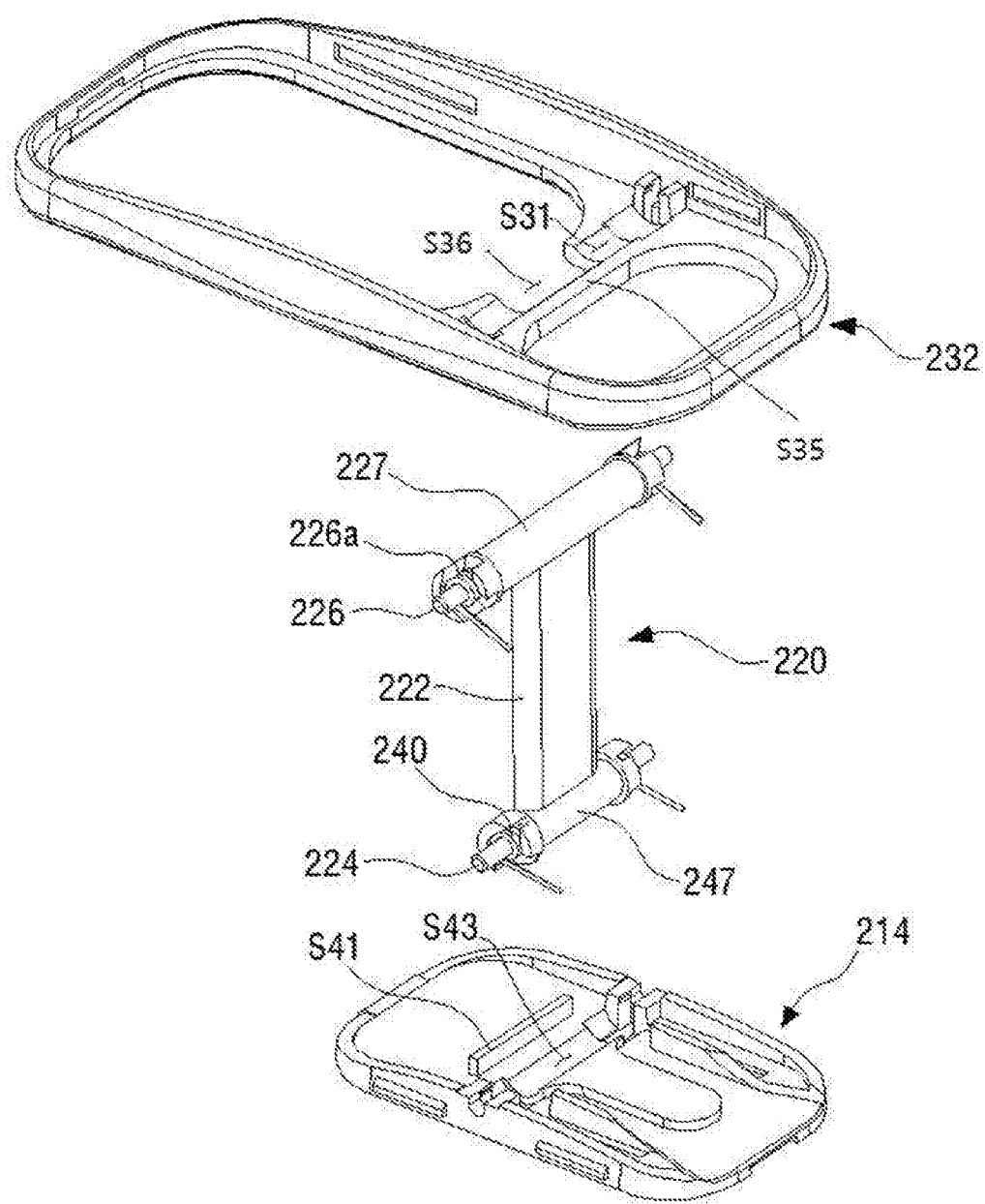

FIG. 12 is a view illustrating a stand-holder 200 for a portable terminal when the stand-holder is used as a holder according to the second embodiment of the present disclosure, FIG. 13 is a perspective view of the stand-holder of the second embodiment, FIG. 14 is a view illustrating the holding portion and the case which are decoupled from each other according to the second embodiment, FIG. 15 is a view illustrating a state in which the coupling portion of the second embodiment is arbitrarily erected for convenience of explanation, FIG. 16 is a cross-sectional view of the stand-holder of the second embodiment illustrated in FIG. 15, FIG. 17 is a view illustrating the stand-holder of the second embodiment when the stand-holder is used as a stand, FIG. 18 is a view illustrating the stand-holder of the second embodiment of FIG. 15 as viewed from the bottom, FIG. 19 is a view to illustrating switchover from an unfolded state to a folded state according to the second embodiment, FIG. 20 is an exploded perspective view of the stand-holder of the second embodiment, FIG. 21 is a view illustrating the stand-holder of the second embodiment of FIG. 20 as viewed from a different angle, FIG. 22 is a view illustrating the holding portion of the second embodiment as viewed from the bottom, and FIGS. 23 to 34 are views illustrating the stand-holder of the second embodiment with some elements omitted or enlarged.

In explaining the second embodiment hereinbelow, reference is made to FIGS. 12 to 34, and a specific drawing may be mentioned according to an element. In addition, the coordinate system illustrated in FIG. 16 is for convenience of explanation, and is equally applied to FIGS. 12 to 15 and FIGS. 17 to 34. Accordingly, it is assumed that, in explaining the second embodiment, the coordinate system illustrated in FIG. 16 is equally applied although the coordinate system is not directly illustrated in FIGS. 12 to 15 and FIGS. 17 to 34.

The difference from the first embodiment will be highlighted, and a person skilled in the art will understand the second embodiment with reference to the description of the first embodiment in some cases. In addition, reference numerals used for elements of the second embodiment are similar to reference numerals used for the elements of the first embodiment having the same or similar functions or structures.

The stand-holder 200 of the second embodiment may include a support portion 210, a coupling portion 220, and a holding portion 230.

The stand-holder 200 of the second embodiment may be in an unfolded state and a folded state like in the first embodiment. The second embodiment 200 may have an "unfolded state" and a "folded state" in the same way as in the first embodiment. The stand-holder for the portable terminal according to the second embodiment 200 may exist in any state of the "unfolded state" and the "folded state" according to user's selection.

The "unfolded state" refers to a state in which the support portion 210 and the coupling portion 220 are spaced apart from each other, and the "folded state" refers to a state in which the coupling portion 220 is received in the holding portion 230 and the support portion 210 and the coupling portion 220 are coupled to each other in contact with each other. The stand-holder may switch from the "unfolded state" to the "folded state," and also, may switch from the "folded state" to the "unfolded state."

When there is no external force in the unfolded state, one end of the holding portion 230 comes into contact with the rear surface of the portable terminal, as will be described below. The support portion 210 may be fixed to the rear surface of the portable terminal T. Although FIGS. 12 to 34 do not depict an attaching means, the support portion 210 may have an attaching means to be fixed to the rear surface.

The support portion 210 may have a solid shape, having a predetermined thickness and having an upper surface and a lower surface, in order to enhance a user's grip. The support portion 210 may have a stop projection S41 formed thereon, and a range of rotation of the coupling portion 220 is determined by the stop projection S41. Due to the presence of the stop projection S41, the user may not rotate the coupling portion 220 unlimitedly.

In addition, the support portion 210 may have a receiving recess 112a to receive the coupling portion, and a seating recess to support a user's finger.

Regarding the support portion 210, reference is made to the description of the support portion 110 of the first embodiment and descriptions which will be made below.

According to the second embodiment, the support portion 210, the coupling portion 220, and the holding portion 230 may be operatively coupled to one another and may be configured to have a recess H1.

In the present embodiment, the coupling portion 220 is operatively connected or coupled with the support portion 210, and the coupling portion 220 is also operatively connected or coupled with the holding portion 230. In the present specification, the coupling portion 220 and the support portion 210 being operatively connected or coupled with each other means that an operation of the coupling portion 220 influences an operation of the support portion 210, and also, an operation of the support portion 210 influences an operation of the coupling portion 220. In addition, the coupling portion 220 and the holding portion 230 being operatively connected or coupled with each other means that an operation of the coupling portion 220 influences an operation of the holding portion 230, and also, an operation of the holding portion 230 influences an operation of the coupling portion 220.

In the present specification, the term "coupling" and the term "connecting" are used as the same meaning.

As illustrated in at least one drawing of FIGS. 12 to 34, the coupling portion 220 may be formed in a bar-like shape, and the cross section of the bar-like shape may have a cylindrical shape, a rectangular shape, or a certain shape. In addition, the bar-like coupling portion 220 includes a first end and a second end. Herein, the first end and the second end refer to distal ends, and the first end of the coupling portion 220 is a portion that is operatively coupled with the support portion 210, and the second end of the coupling portion 220 is a portion that is operatively coupled with the holding portion 230.

As illustrated in at least one drawing of FIGS. 12 to 34, the first end of the coupling portion 220 and the support portion 210 are operatively coupled with each other, such that the coupling portion 220 is rotated relative to the support portion 210. In addition, the second end of the coupling portion 220 and the holding portion 230 are operatively coupled with each other, such that the holding portion 230 is rotated relative to the coupling portion 220.

According to the second embodiment, the first end of the coupling portion 220 and the support portion 210 are operatively coupled to each other, such that the coupling portion 220 receives torque in a first direction. In addition, the second end of the coupling portion 220 and the holding portion 230 are operatively coupled to each other, such that the holding portion 230 receives torque in a second direction.

As will be described below, the coupling portion 220 receives torque in the first direction by the first pivoting module, and the holding portion 230 receives torque in the second direction by the second pivoting module.

Figure 34:
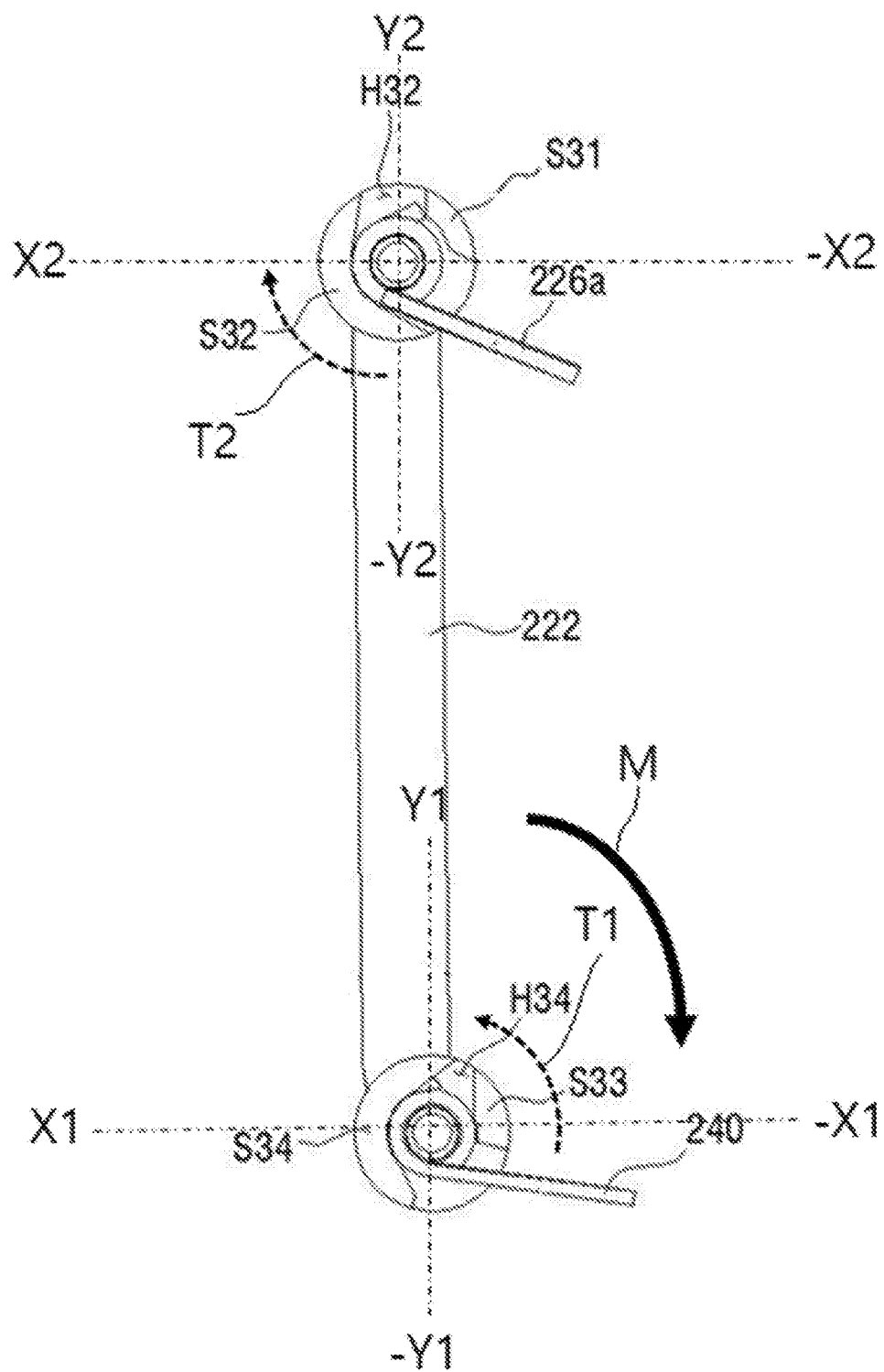

In the present specification, the first direction refers to a direction in which the coupling portion 220 is erected (arrow direction indicated by T1 in FIGS. 16 and 34), and the second direction refers to a direction in which erection of the coupling portion 220 in the first direction is interfered with (arrow direction indicated by T2 in FIGS. 16 and 34).

According to the second embodiment, the center of gravity of the holding portion 230 is changed by the rotation of the holding portion 230 in the second direction to interfere with the erection of the coupling portion 220 in the first direction. That is, when the holding portion 230 is rotated in the second direction, a position of the center of gravity of the holding portion 230 is changed by the rotation. Such a change in the position of the center of gravity is made in the direction of interfering with the erection of the coupling portion 220 in the first direction, and the coupling portion 220 is moved in the opposite direction of the first direction due to the change in the position of the center of gravity (arrow direction indicated by M in FIGS. 16 and 34).

The support portion 210 of the stand-holder 200 according to the present embodiment may comprise a support member 212 and a housing 214.

The support member 212 is operatively coupled with the coupling portion 220. That is, the support member 212 and the coupling portion 220 are coupled to each other, such that the support member 212 is inserted into a certain space (for example, the receiving portion 233) of the holding portion 230 in the folded state, and escapes from the space of the holding portion 230 to be spaced apart from the holding portion 230 in the unfolded state.

For example, the coupling portion 220 is rotatably coupled with the support member 212. In addition, the support member 210 is configured to be inserted into a certain space (for example, a support portion receiving recess 233) of the holding portion 230.

The housing 214 may be coupled a lower surface of the support member 212.

The support member 212 may have a receiving recess 212a formed on an upper surface thereof, and the receiving recess 212a may be formed on the upper surface of the support member 212 in a vertical direction (a direction parallel to the Z1 axis).

The receiving recess 212a is configured to receive a coupling member 222 of the coupling portion 220 when the coupling member 222 is folded.

A stop projection S41 may be formed at a rear end of the receiving recess 212a. When the coupling member 222 is unfolded (that is, in the unfolded state), an unfolding angle may be determined by the stop projection S41.

That is, when the user arbitrarily presses the coupling portion 220 toward a second position (P2) of the rear surface, the coupling portion 220 is rotated until the coupling portion 220 is stopped by the stop projection S41, and is not rotated anymore when the coupling portion 220 is stopped by the stop projection S41. That is, the coupling member 220 is not unfolded by more than a predetermined angle by the stop projection S41.

The housing 214 may have a first pivoting module receiving portion S43 configured to receive a first pivoting module (which will be described below). In the second embodiment, the first pivoting module receiving portion S43 is formed in a direction (a direction parallel to the Z1-axis direction) perpendicular to the longitudinal direction of the support portion 210 (that is, a direction parallel to the housing 214, or a direction parallel to the X1-axis direction). In the present embodiment, the above-described stop projection S41 is positioned in parallel with the first pivoting module receiving portion S43.

The coupling portion 220 may couple the support portion 210 and the holding portion 230, and may have a solid structure having both ends.

The coupling portion 220 may include the coupling member 222, the first pivoting module, and a second pivoting module. Herein, the first pivoting module may include a first pivoting member 224, a first body 247 configured to allow the first pivoting member 224 to be inserted thereinto, and a first torsion spring 240, and the second pivoting module may include a second pivoting member 226, a second body 227 to allow the second pivoting member 226 to be inserted thereinto, and a second torsion spring 226a.

In the present embodiment, the coupling member 222 includes ends (that is, a first end and a second end), and has a bar-like shape having a predetermined length. The first end of the coupling member 222 and the support portion 210 are hinged to each other by the first pivoting module, and the second end of the coupling member 222 and the holding portion 230 are hinged to each other by the second pivoting module.

In the present embodiment, the coupling member 222 is configured to always maintain a constant angle with the first pivoting module. Specifically, the coupling member 222 is fixedly coupled with the first body 247 to form a constant angle (for example, 90 degree) therewith. In addition, the coupling member 222 is configured to always maintain a constant angle with the second pivoting module. Specifically, the coupling member 222 is fixedly coupled with the second body 227 to form a constant angle therewith.

In the present embodiment, the first body 247 is a cylindrical structure having a predetermined length, and a longitudinal direction of the first body 247 is the same direction as the rotation axis of the first body 247.

A center of the first body 247 refers to a point where an extension line (virtual line) of the coupling member 222 in the longitudinal direction and an extension line (virtual line) of the first body 247 in the longitudinal direction intersects.

In the present embodiment, the first pivoting module and the support portion 210 are coupled to each other by means of a hinge to enable the coupling portion 220 to be rotated. Specifically, the first body 247 is rotatably received in the first pivoting module receiving portion S43. In the present embodiment, the first torsion spring 240 is a spring having both ends, and the first torsion spring 240 has one end (hereinafter, a "fixed end") coupled to the housing 214 and the other end (hereinafter, a "free end") coupled to one end (hereinafter, a "first end") of the first body 247. Herein, the first end of the first body 247 is configured to be coupled with the free end of the first torsion spring 240.

In the present embodiment, when an external force from a user does not exist, the first body 247 is rotated such that the coupling member 222 inclines toward the rear surface of the portable terminal.

A direction of torque that the first torsion spring 240 applies to the first body 247 (that is, the first direction) is opposite to the real rotation direction of the first body 247. Regarding the direction of the torque that the first torsion spring 240 applies to the first body 247, and the real rotation direction of the first body 247 (real rotation direction of the coupling member 222), reference is made to FIGS. 16 and 34. The reason why the first body 247 is rotated in the opposite direction of the first direction, rather than in the first direction, although the first body 247 is subjected to the torque in the first direction by the first torsion spring 240, will be described in detail below.

The first end of the first body 247 and the free end of the first torsion spring 240 are coupled to each other. The fixed end of the first torsion spring 240 is coupled to the housing 214. The free end of the first torsion spring 240 applies a torsion or torque to the first end of the coupling member 222 in such a direction that the coupling member 222 is erected (that is, the first direction). However, the real rotation direction of the coupling member 222 is opposite to the erection direction (that is, the first direction) although the coupling member 222 is subjected to the torque by the first torsion spring 240.

In the present embodiment, the first body 247 is rotatably received in the first pivoting module receiving portion S43, and one end of the first torsion spring 240 is coupled to the housing 214 and the other end of the first torsion spring 240 is coupled to one end of the first body 247. In the unfolded state of the stand-holder for the portable terminal, when no external force is applied to the coupling portion 220, the first body 247 is rotated to allow the coupling portion 220 to incline toward the rear surface of the portable terminal.

Herein, a "first position" (P1) of the rear surface of the portable terminal is a position of the rear surface which is in contact with one end of the holding portion 230 when no external force is applied to the coupling portion 220. In addition, when no external force is applied to the coupling portion 220, the other end of the holding portion 230 is spaced apart from the rear surface of the portable terminal, and a position of the rear surface facing the other end of the holding portion 230 is referred to as a "second position" (P2).

In the present embodiment, the first position P1 and the second position P2 are different from each other, and both exist on the rear surface of the portable terminal. Specifically, a virtual line V extended through the center of the first body 247 in the same direction as the longitudinal direction of the support portion 210 is assumed. A line obtained by orthogonally projecting the virtual line V onto the rear surface of the portable terminal is referred to as a center line on the rear surface of the portable terminal in the present specification. The first position P1 and the second position P2 are positioned on the center line on the rear surface of the portable terminal, and the first position P1 is positioned in the forward direction of the support portion 210 and the second position P2 is positioned in the backward direction of the support portion 210. A direction of the forward direction and the backward direction that is close to the coupling portion 220 when there is no external force in the unfolded state of the stand-holder for the portable terminal is the forward direction.

According to the present embodiment, the coupling portion 220 and the holding portion 230 are coupled to each other, such that, when user's fingers are inserted between the support portion 210 and the holding portion 230 in the unfolded state of the stand-holder for the portable terminal (referring to FIG. 12), one end of the holding portion 230 in contact with the rear surface of the portable terminal presses the user's finger toward the forward direction of the support portion.

In the present embodiment, the first torsion spring 240 may be provided as one pair of torsion springs, and the pair of first torsion springs 240 have the same configuration and are operated in the same way.

The coupling portion 220 has a cuboidal shape having a predetermined length. In the present embodiment, the coupling portion 220 is supported by the support portion 210, and also, is coupled with the support portion 210 to be rotatable. In addition, the holding portion 230 is supported by the coupling portion 220, and is coupled with the coupling portion 220 to be rotatable.

For example, the first pivoting module is coupled to one end of the coupling member 222, and the second pivoting module is coupled to the other end of the coupling member 222. In the present embodiment, one end of the coupling member 222 is fixedly coupled to the first boy 247, and the other end of the coupling member 222 is fixedly coupled to the second body 227.

In the present embodiment, the second pivoting module and the holding portion 230 are coupled to each other by means of a hinge such that the holding portion 230 can be rotated. Specifically, the second body 227 is received in a second pivoting module receiving portion S31 (which will be described below) of the holding portion 230. In particular, referring to FIGS. 27 and 28, the coupling member 222 is inserted into an opening S33 of the holding portion 230, and in this state, the second body 247 is received in the second pivoting module receiving portion S31 (which will be described below).

In the present embodiment, the second torsion spring 226a is a spring having both ends, and the second torsion spring 226a has one end (hereinafter, a "fixed end") coupled to the holding portion 230 and the other end (hereinafter, a "free end") coupled to one end (hereinafter, a "first end") of the second body 227. Herein, the first end of the second body 227 is configured to be coupled with the free end of the second torsion spring 226a.

In the present embodiment, in the unfolded state of the stand-holder for the portable terminal, when no external force is applied, the holding portion 230 and the coupling portion 220 move toward the rear surface of the portable terminal T to form the "A"-shaped structure or the seesaw structure. That is, one end F1 of the holding portion 230 comes into contact with the rear surface of the portable terminal T, and the other end F2 of the holding portion 230 is spaced apart from the rear surface of the portable terminal T, and the coupling member 222 is inclined in the same direction as one end F1 of the holding portion 230.

The second body 227 coupled to the free end of the second torsion spring 226a is coupled to the support portion 210, and the support portion 210 is coupled to the portable terminal. Therefore, the fixed end of the second torsion spring 226a applies a torsion or a torque to the holding portion 230 and the holding portion 230 rotates by such a torque.

In the present embodiment, in the unfolded state, the holding portion 230 is rotated by the second torsion spring 226a as long as there is no external force. Regarding the rotation direction of the holding portion 230 by the second torsion spring 226a, reference is made to FIGS. 16 and 34.

The holding portion 230 is not unlimitedly rotated, and a maximum radius of rotation is determined by a stop projection S35 formed on the holding portion 230. In the present embodiment, the holding portion 230 has the stop projection S35 formed thereon to be prevented from rotating by more than a predetermined angle (for example, 90 degrees). Herein, the predetermined angle is an angle that is formed by the holding portion 230 and the coupling portion 220 (for example, θ2 in FIG. 16), and refers to an angle from the coupling portion 220 to the holding portion 230 in the rotation direction of the holding portion 230 (for example, θ2 in FIG. 16). A maximum radius of rotation of the holding portion 230 will be easily understood with reference to FIG. 18. That is, when the holding portion 230 is rotated by more than the predetermined angle, the stop projection S35 is locked by the upper portion of the coupling portion 220 and the holding portion 230 is not rotated any more.

In the present specification, the holding portion 230 being rotated in a parallel direction means that the holding portion 230 is rotated in a direction to be parallel to the support portion 210.

In the present embodiment, the second body 227 is rotatably received in the second pivoting module receiving portion S31, and one end of the second torsion spring 226a is coupled to the holding portion 230 and the other end of the second torsion spring 226a is coupled to one end of the second body 227. According to the configuration described above, as long as there is no external force applied to the coupling portion 220 in the unfolded state, the second body 227 is rotated until the holding portion 230 and the support portion 220 are wholly horizontal. If the stop projection S35 is not provided on the holding portion 230, the second body 227 may be rotated unlimitedly.

An operation of switching from the folded state to the unfolded state will be described with reference to FIG. 16. When the stand-holder is released from the folded state, the coupling portion 220 starts to be rotated in the first direction (arrow direction indicated by T1), and the holding portion 230 starts to be rotated in the second direction (arrow direction indicated by T2). Thereafter, the angle θ2 between the holding portion 230 and the coupling portion 220 is closer to 90 degrees, and accordingly, the position of the center of gravity of the coupling portion 200 is moved in the forward direction, and the coupling portion 220 is rotated in the forward direction (arrow direction indicated by M).

Thereafter, when one end of the holding portion 230 comes into contact with the rear surface of the portable terminal T, the angle between the holding portion 230 and the coupling portion 220 is maintained at an angle smaller than 90 degrees.

According to the above-described configuration, the stand-holder for the portable terminal according to the second embodiment is in the unfolded state, that is, has the "A"-shaped structure or the "seesaw" structure. The unfolded state refers to a state in which one end of the holding portion 230 is in contact with the first position of the rear surface of the portable terminal, and the other end of the holding portion 230 is spaced apart from the second position of the rear surface of the portable terminal, and the coupling portion 220 is inclined toward the forward direction.

As described above, in the unfolded state, the first torsion spring 240 applies torque to the coupling portion 220 in the direction of erecting (that is, the first direction), but the coupling portion 220 is not rotated to the extent that the angle θ1 between the coupling portion 220 and the support portion 210 reaches 90 degrees.

This is because the holding portion 230 is also rotated in the unfolded state (that is, is rotated in the second direction), and the position of the center of gravity of the holding portion 230 is moved in the forward direction by the rotation (that is, the position of the center of gravity is moved in the opposite direction of the erection direction of the coupling portion 220). As the position of the center of gravity is moved in the forward direction, the weight of the holding portion 230 is larger than the torque of the coupling portion 220 (rotational force in the erection direction of the coupling portion 220).

To achieve this configuration, elastic forces of the first torsion spring 240 and the second torsion spring 226a, structures and arrangements of the hemispherical structures S33, S34 formed on the first body 247 and the hemispherical structures S31, S32 formed on the second body 227, a change in the position of the center of gravity when the holding portion 230 is rotated, and weight of the holding portion 230 may be appropriately adjusted as factors to be considered. For example, the elastic force of the second torsion spring 226a should be great enough to rotate the holding portion 230 in the parallel direction, and the elastic force of the first torsion spring 240 should be great enough to rotate the coupling portion 220, but should not be so strong to overcome the weight of the holding portion 230 the position of the center of gravity of which is moved in the forward direction. Furthermore, the elastic force of the second torsion spring 226a should be determined to enable a user's finger to be inserted between the support portion 210 and the holding portion 230, and also to allow the holding portion 230 to sufficiently press the finger to prevent it from being easily released (see FIG. 12).

As described above, according to the above-described configuration of the stand-holder for the portable terminal according to the second embodiment, when user's fingers are inserted between the support portion 210 and the holding portion 230 in the unfolded state (FIG. 12), one end of the holding portion 230 in contact with the rear surface of the portable terminal is spaced apart from the rear surface and presses the fingers toward the first position of the rear surface. In addition, the other end of the coupling portion 220 and the holding portion 230 are coupled to each other, such that, the other end of the holding portion 230 comes closer to the second position of the rear surface (that is, toward the rear direction of the support portion 210).

That is, in the unfolded state, the elastic force of the second torsion spring 226a generates torque to rotate the holding portion 230 toward the rear surface of the portable terminal, and such torque acts as a force for pressing a finger when a user's finger is inserted between the support portion 210 and the holding portion 230.

Figure 29:
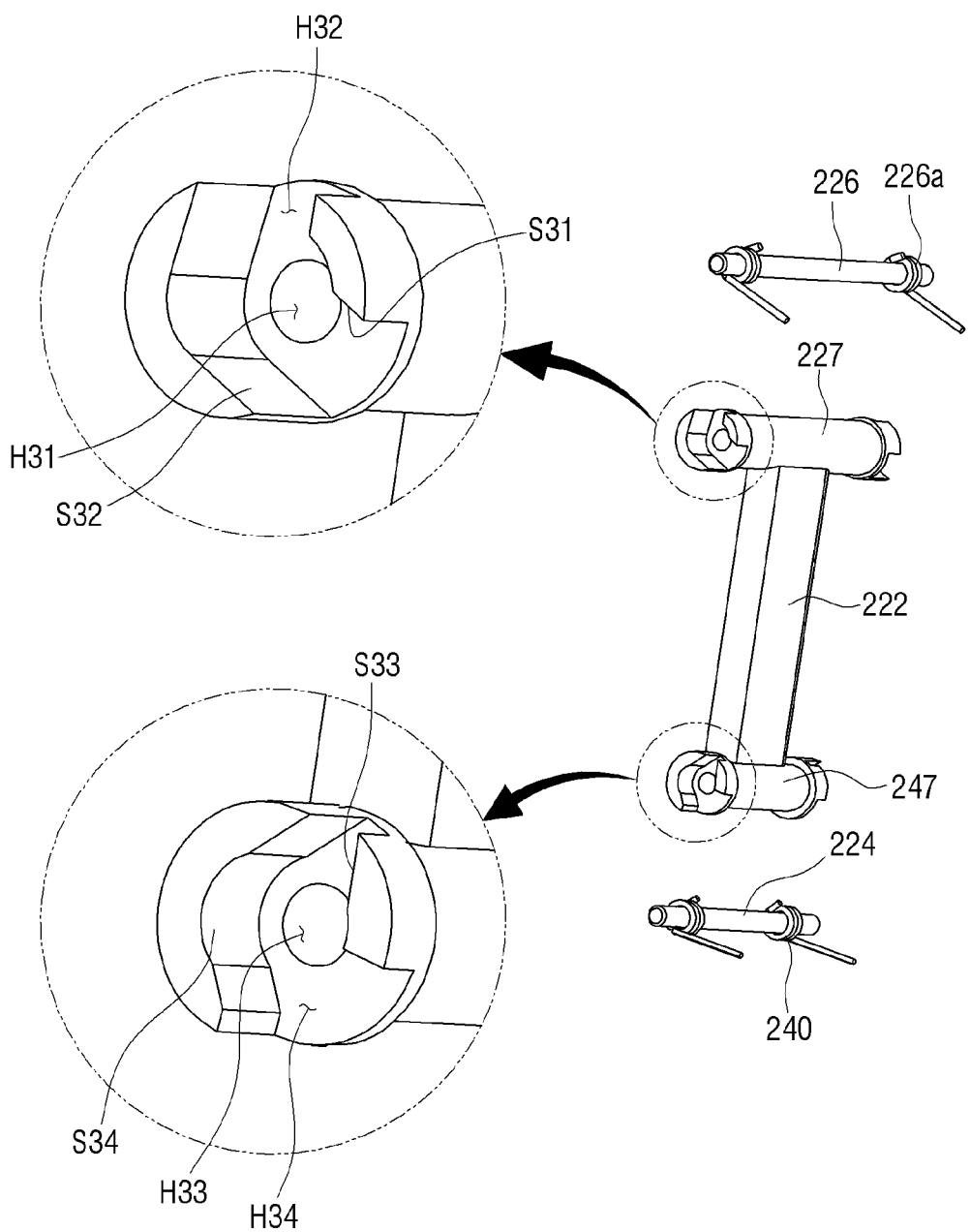
Figure 30:
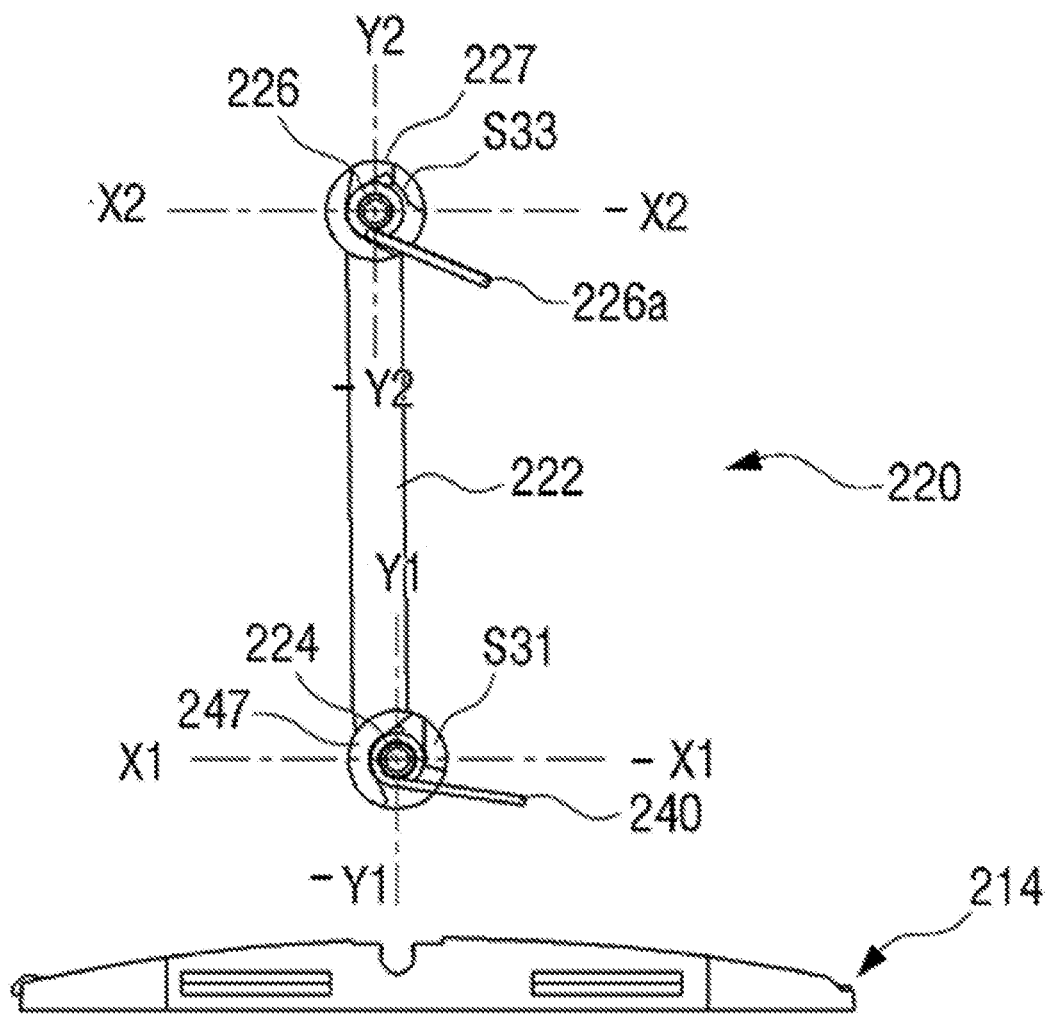
Figure 31:
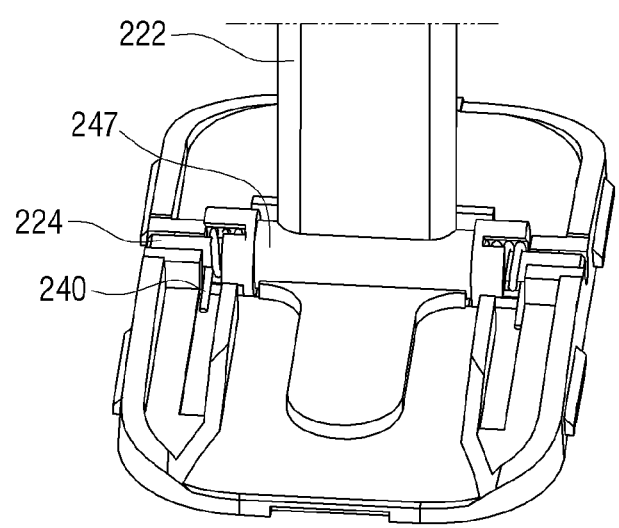
Figure 32:
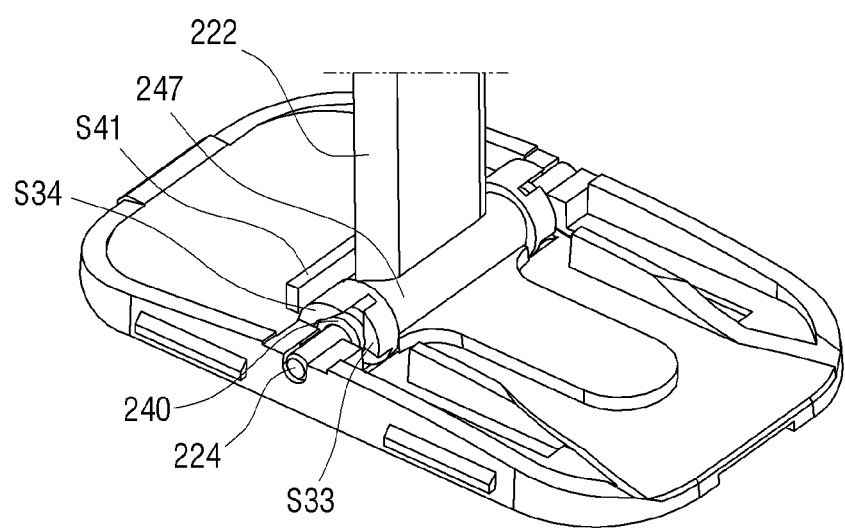
Figure 33:
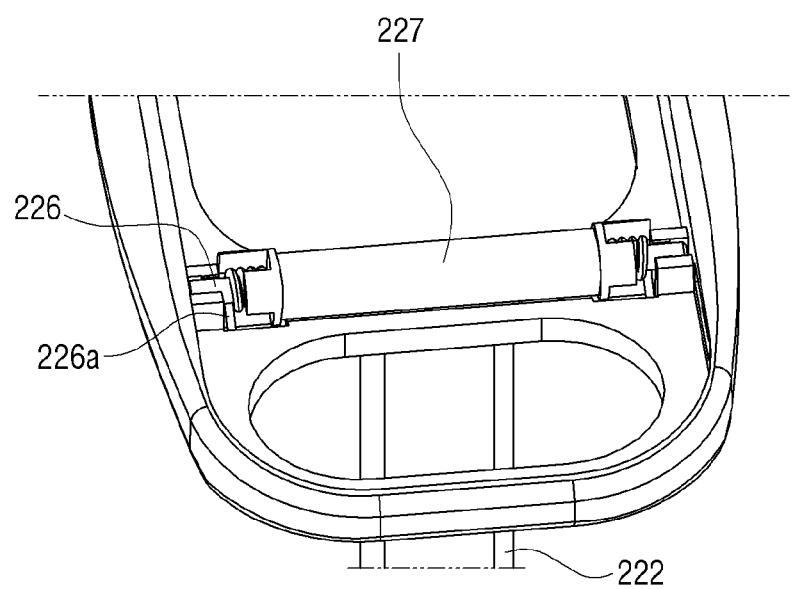

The first body 247 and the second body 227 will be described in detail with reference to FIG. 29.

The first body 247 may have a hole H33 formed in the center thereof to allow the first pivoting member 224 to penetrate therethrough, and the first torsion springs 240 are coupled to both ends of the first body 247. Herein, the first torsion spring 240 is configured in the form of a coil having an empty space in the center thereof, and the first pivoting member 224 penetrates through the center of the first torsion spring 240.

Since both ends of the first body 247 are the same in the structure and the function, only one end of the first body 247 will be described. One end of the first body 247 has hemispherical structures S33, S34 separated from each other. The hemispherical structures S33, S34 are positioned to face each other, and provide a space H34 to accommodate the first torsion spring 240. In addition, the hemispherical structures S33, S34 are positioned to restrict a movement of the first torsion spring 240. In particular, the hemispherical structures S33, S34 are arranged to have the first torsion spring 240 generate a torsion or a torque for inclining the coupling member 222 toward the portable terminal (in the direction of θ1). In the present embodiment, the fixed end of the first torsion spring 240 is fixedly coupled to the housing 214, and the free end of the first torsion spring 240 applies a torsion or torque to any one (S34) of the hemispherical structures S33, S34, thereby rotating the first body 247.

The second body 227 may have a hole H31 formed in the center thereof to allow the second pivoting member 226 to penetrate therethrough, and the second torsion springs 226a are coupled to both ends of the second body 227. Herein, the second torsion spring 226a is configured in the form of a coil having an empty space in the center thereof, and the second pivoting member 226 penetrates through the center of the second torsion spring 226a.

Since both ends of the second body 227 are the same as each other in the structure and the function, only one end of the second body 227 will be described.

One end of the second body 227 has hemispherical structures S31, S32 separated from each other. The hemispherical structures S31, S32 are positioned to face each other, and provide a space H31 to accommodate the second torsion spring 226a. In addition, the hemispherical structures S31, S32 are positioned to restrict a movement of the second torsion spring 226a.

In particular, the hemispherical structures S31, S32 are arranged to have the second torsion spring 226a generate a torsion or a torque for rotating the second pivoting member 226 inserted into the second body 227.

From now on, a coupling relationship between the support member 212 and the housing 214 will be described with reference to FIGS. 23 to 26.

In the present embodiment, structures for coupling the support member 212 and the housing 214 are formed on an inner edge of the support member 212 and an outer edge of the housing 214. For example, concave portions R31, R32, R33, R34 are formed on the inner edge of the support member 212, and protrusions E41, E42, E43, E44 are formed on the outer edge of the housing 214. The protrusions E41, E42, E43, E44 are received in the concave portions R31, R32, R33, R34, such that the support member 221 and the housing 214 are coupled to each other.

Referring to FIGS. 21 to 26, a coupling relationship of the support portion 210 received in the holding portion 230 will be described. In the present embodiment, structures for coupling the support portion 210 and the holding portion 230 are formed on an outer edge of the support member 212 of the support portion 210 and an inner edge of the holding member 232 of the holding portion 230. These structures are configured to easily couple and decouple the support portion 210 and the holding portion 230 by a user's external force.

For example, protrusions E31, E32 are formed on the outer edge of the support member 212, and receiving structures G11, G12 are formed on the inner edge of the holding member 232. Herein, the protrusions E31, E32 correspond to and are coupled to the receiving structures G11, G12. Since the structures and the coupling principle of these are the same, only the coupling between the receiving structure G11 and the protrusion E31 will be described. The receiving structure G11 includes a spacing gap D11 and an extension portion R13. The extension portion R13 is spaced apart from the edge of the holding member 232 by the spacing gap D11, and is extended.

When the support member 212 is inserted into a space 233 of the holding member 232, the extension portion R13 of the holding member 232 and the protrusion E31 of the support member 212 physically come into contact with each other, and the protrusion E31 presses the extension portion R13. The extension portion R13 which is subjected to the force of the protrusion E31 is pushed in the direction to reduce the spacing gap D11, that is, toward the edge of the holding member 232, due to the presence of the spacing gap D11. Since the extension portion R13 extends from the edge of the holding member 232, the extension portion R13 repels in response to the force of the protrusion E31. The support portion 210 and the holding portion 230 are coupled to each other by the repellence. In the present embodiment, the extension portion R13 may be formed by a material (for example, plastic) having elasticity of a certain degree.

The protrusion E31 and the extension portion R13 are easily decoupled from each other by the user pulling the holding portion 230 apart from the support portion 210.

The stand-holder in the second embodiment may serve as a holder and a stand in the unfolded state as in the first embodiment.

The coupling member 222 may space the support portion 210 and the holding portion 230 apart from each other by a predetermined distance. The first pivoting module and the second pivoting module are coupled to both ends of the coupling member 222 by means of a hinge.

The first pivoting module and the second pivoting module in the second embodiment are exemplary, and a person skilled in the art can easily use other coupling means for rotatably coupling the coupling member 222 to the support portion 210 and the holding portion 230.

According to this configuration, the stand-holder for the portable terminal according to the present embodiment has the "A"-shaped structure or the "seesaw" structure in the unfolded state.

According to the "A"-shaped structure or the "seesaw" structure, when user's finger is placed on the support portion 210, the upper side of the holding portion 230, specifically, the upper side of the holding member 232, presses the finger, such that the user can comfortably and tightly grip the portable terminal while operating the portable terminal.

In the present embodiment, the support member 212 has a seating recess 212b formed on the upper surface thereof, on which the receiving recess 212a is formed. In the unfolded state, user's finger may be positioned on the receiving recess 212a and the seating recess 212b. The seating recess 212b allows the user's finger to be stably seated thereon, such that the user can tightly grip the portable device. In the folded state, a portion of the coupling member 122 is positioned on the seating recess 212b.

As described above, the holding portion 230 is rotated with reference to the second pivoting module, thereby forming the "seesaw" structure in which the upper portion of the holding portion 230 presses user's finger, and the lower portion of the holding portion 130 is spaced apart from the rear surface D of the portable terminal T. Therefore, the user can use the portable terminal T stably and comfortably.

The holding portion 230 is rotatably coupled to the other end of the coupling portion 220. When the user grips the portable terminal with user's fingers, the holding portion 230 presses the outer surfaces of the user's fingers toward the rear surface of the portable terminal, and allows the user to stably grip the portable terminal, and, when the user does not grip the portable terminal, the holding portion 230 is supported on a floor surface, and may stand the portable terminal in the landscape or portrait orientation.

According to the present embodiment, the holding portion 230 includes the holding member 232 and a case 234. The holding member 232 may have the stop projection S35 to restrict a radius of rotation of the holding portion 230 (specifically, the holding member 232) in the parallel direction.

In the present specification, the stop projection S35 is formed in parallel to the second pivoting module. Specifically, the stop projection S35 is formed between the gripping recess H1 (H11, H12) and the support portion receiving recess 233 which will be described below.

According to the present embodiment, the gripping recess H1 (H11, H12), the stop projection S35, a second pivoting module receiving portion S31, and the support portion receiving recess 233 are arranged in sequence.

In the present embodiment, the holding portion 230 is coupled with the second pivoting module of the coupling portion 220 by means of a hinge.

The holding member 232 further includes the support portion receiving recess 233 to receive the support portion 210 with the coupling member 222 being folded.

The holding member 232 may also include the gripping recess H1. Herein, the gripping recess H1 may be a penetrating hole, for example.

The holding member 232 may further include the second pivoting module receiving portion S31, and the second pivoting module receiving portion S31 is positioned between the gripping recess H1 and the support portion receiving recess 232.

When the support portion 210 is completed received in the support portion receiving recess 233 of the holding portion 230, a bottom surface (a surface to come into contact with the rear surface of the portable terminal T) of the support portion 210 and a bottom surface (a surface to come into contact with the rear surface of the portable terminal T) of the holding portion 230 have a substantially same height (a height from the rear surface of the portable terminal T). To achieve this, a geometrical shape of the support portion 210 (height, width, or shape of the support portion 210) is configured to be completely received in the support portion receiving recess 233.

For example, the term "substantially same" includes a case in which, when the support portion 210 is completely received in the support portion receiving recess 233 of the holding portion 230, the bottom surface of the support portion 210 and the bottom surface of the holding portion 230 come into contact with the rear surface of the portable terminal T simultaneously.

In another example, the term "substantially same" includes a case in which, when the support portion 210 is completely received in the support portion receiving recess 233 of the holding portion 230, only the bottom surface of the holding portion 230 comes into contact with the rear surface of the portable terminal T, and the bottom surface of the support portion 210 does not come into contact with the rear surface of the portable terminal T.

In still another example, the term "substantially same" includes a case in which, when the support portion 210 is completely received in the support portion receiving recess 233 of the holding portion 230, only the bottom surface of the support portion 210 comes into contact with the rear surface of the portable terminal T, and the bottom surface of the holding portion 230 does not come into contact with the rear surface of the portable terminal T, but is spaced apart therefrom by 0.5 mm or less.

The holding portion 230 has the gripping recess H1 formed thereon, and a recess H11 of the holding member 232 and a recess H12 of the case 234 define the gripping recess H1. To achieve this, the recess H11 of the holding member 232 and the recess H12 of the case 234 may have the same or similar shape, and are formed opposite each other (that is, face each other).

The case 234 is for covering the upper surface of the holding member 232. Structures for coupling the case 234 and the holding member 232 are formed on an outer edge of the case 234 and an inner edge of the holding member 232 to correspond to each other. For example, structures E11, E12, E13, E14 are formed on the outer edge of the case 234, and structures R21, R22, R23, R24 are formed on the inner edge of the holding member 232. These structures may protrude or may be depressed to be coupled to each other. In the present embodiment, the structures E11, E12, E13, E14 protrude, and the structures R21, R22, R223, R25 are depressed in the form of recesses.

The case 234 may have a receiving space R11 formed thereon to receive at least part of the second pivoting module (for example, an upper portion of the second pivoting module). As will be described below, the second pivoting module includes a second pivoting member 226, a second body 227 configured to have the first pivoting member 226 inserted thereinto, and the first torsion spring 240, and a lower portion of the second body 227 is positioned in the second pivoting module receiving portion S31 of the holding member 232, and an upper portion of the second body 227 is positioned in the receiving space R11 of the case 234.

According to the present embodiment, the support member 212 of the support portion 210 is received in the support portion receiving recess 233 formed inside the holding portion 230, such that the volume of the stand-holder in the folded state can be minimized.

According to the present embodiment, when the support portion 210 and the holding portion 230 are decoupled from each other, the stand-holder for the portable terminal according to the present embodiment is in the unfolded state. When the support portion 210 and the holding portion 230 are decoupled from each other, the coupling member 222 is inclined toward the portable terminal, and the front end of the holding portion 230 comes into contact with the rear surface of the portable terminal, and the rear end of the holding portion 230 is spaced apart from the surface of the portable terminal.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A stand-holder for a portable terminal, the stand-holder comprising:
    a support portion fixed to a rear surface of the portable terminal;
    a holding portion; and
    a coupling portion operatively coupled to the support portion and the holding portion, the coupling portion being formed in a bar-like shape comprising a first end and a second end,
    wherein the first end of the coupling portion and the support portion are operatively coupled to each other, such that the coupling portion is rotated relative to the support portion,
    wherein the second end of the coupling portion and the holding portion are operatively coupled to each other, such that the holding is rotated relative to the coupling portion,
    wherein the stand-holder for the portable terminal has an unfolded state and a folded state, and exists in any one state of the unfolded state and the folded state according to a user's selection,
    wherein the unfolded state is a state in which the support portion and the coupling portion are spaced apart from each other, and the folded state is a state in which the coupling portion is received in the holding portion and the support portion and the coupling portion are detachably coupled to each other in contact with each other,
    wherein the first end of the coupling portion and the support portion are operatively coupled to each other, such that the coupling portion receives torque in a first direction,
    wherein the second end of the coupling portion and the holding portion are operatively coupled to each other, such that the holding portion receives torque in a second direction,
    wherein the first direction is a direction in which the coupling portion is erected, and the second direction is a direction in which erection of the coupling portion in the first direction is interfered with;
    wherein the coupling portion comprises a coupling member, a first pivoting module, and a second pivoting module, and
    wherein one end of the coupling member and the support portion are hinged to each other by the first pivoting module, and the other end of the coupling member and the holding portion are hinged to each other by the second pivoting module;

wherein the first pivoting module comprises: a first pivoting member; a first body formed in a cylindrical shape and having a penetrating hole formed therein to allow the first pivoting member to be inserted thereinto, and a first torsion spring, wherein the support portion has a first pivoting module receiving portion formed thereon to rotatably receive the first pivoting module, and wherein the first body is rotatably received in the first pivoting module receiving portion, the first torsion spring elastically connects the holding portion and the first body to allow the first body to be rotated;

wherein hemispherical structures separated from one another are formed on one end of the first body, and the hemispherical structures provide a space to receive the first torsion spring, and the hemispherical structure are positioned opposite to one another to restrict a movement of the first torsion spring within a pre-defined range.

2. The stand-holder for the portable terminal of claim 1, wherein, due to a rotation of the holding portion in the second direction, a center of gravity of the holding portion is moved to a position where the erection of the coupling portion in the first direction is interfered with.

3. The stand-holder for the portable terminal of claim 2, wherein, when there is no external force in the unfolded state, one end of the holding portion comes into contact with the rear surface of the portable terminal.

4. The stand-holder for the portable terminal of claim 1, wherein a stop projection is formed on the support portion, and a range of a rotation of the coupling portion is defined by the stop projection.

5. The stand-holder for the portable terminal of claim 4, wherein the support portion has a receiving recess for receiving the coupling member.

6. The stand-holder for the portable terminal of claim 4, wherein a seating recess is formed on the support portion to support a finger.

7. The stand-holder for the portable terminal of claim 1, wherein the first body and the coupling member are coupled to each other to maintain an angle therebetween.

8. The stand-holder for the portable terminal of claim 1, wherein the second pivoting module comprises a second pivoting member, a second body formed in a cylindrical shape having a penetrating hole formed therein to allow the second pivoting member to be inserted thereinto, and a second torsion spring, wherein the holding portion has a second pivoting module receiving portion formed thereon to receive the second pivoting module to be rotatable therein, wherein the second body is rotatably received in the second pivoting module receiving portion, and the second torsion spring elastically connects the holding portion and the second body to allow the holding portion to be rotated.

9. The stand-holder of claim 8, wherein hemispherical structures separated from each other are formed on one end of the second body, and the hemispherical structure provide a space to receive the second torsion spring, and are positioned to face each other to restrict a movement of the second torsion spring within a predetermined range.

10. The stand-holder of claim 8, wherein the second body and the coupling member maintain a constant angle therebetween.

* * * * *